(12) United States Patent
Kuroi et al.

(10) Patent No.: US 6,744,113 B2
(45) Date of Patent: Jun. 1, 2004

(54) SEMICONDUCTOR DEVICE WITH ELEMENT ISOLATION USING IMPURITY-DOPED INSULATOR AND OXYNITRIDE FILM

(75) Inventors: Takashi Kuroi, Tokyo (JP); Tomohiro Yamashita, Tokyo (JP); Katsuyuki Horita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/377,829

(22) Filed: Mar. 4, 2003

(65) Prior Publication Data

US 2004/0053458 A1 Mar. 18, 2004

(30) Foreign Application Priority Data

Sep. 13, 2002 (JP) ........................... 2002-268051

(51) Int. Cl.[7] ............................................... H01L 29/00
(52) U.S. Cl. .................. 257/510; 257/374; 257/395; 257/397; 257/513; 257/639; 438/207; 438/221; 438/225
(58) Field of Search .................. 257/305, 333, 257/374, 389, 395–399, 510–521, 632–651; 438/207, 221, 225

(56) References Cited

U.S. PATENT DOCUMENTS

| 4,855,804 | A | * | 8/1989 | Bergami et al. ............ 257/622 |
| 5,099,304 | A | * | 3/1992 | Takemura et al. ......... 257/647 |
| 5,492,858 | A | * | 2/1996 | Bose et al. ................. 438/437 |
| 5,763,315 | A | * | 6/1998 | Benedict et al. ........... 438/424 |
| 6,046,487 | A | * | 4/2000 | Benedict et al. ........... 257/510 |
| 6,265,743 | B1 | | 7/2001 | Sakai et al. |
| 6,498,383 | B2 | * | 12/2002 | Beyer et al. ................ 257/510 |

FOREIGN PATENT DOCUMENTS

JP 2000-332099 * 11/2000

* cited by examiner

Primary Examiner—David Nelms
Assistant Examiner—Andy Huynh
(74) Attorney, Agent, or Firm—Oblon, Spivak, McClelland, Maier & Neustadt, P.C.

(57) ABSTRACT

In a trench (2), an oxynitride film (31ON1) and a silicon oxide film (31O1) are positioned between a doped silicon oxide film (31D) and a substrate (1), and a silicon oxide film (31O2) is positioned closer to the entrance of the trench (2) than the doped silicon oxide film (31D). The oxynitride film (31ON1) is formed by a nitridation process utilizing the silicon oxide film (31O1). The vicinity of the entrance of the trench (2) is occupied by the silicon oxide films (31O1, 31O2) and the oxynitride film (31ON1).

10 Claims, 26 Drawing Sheets

SEMICONDUCTOR DEVICE WITH ELEMENT ISOLATION USING IMPURITY-DOPED INSULATOR AND OXYNITRIDE FILM

BACKGROUND OF THE INVENTION

1. Field of the Invention

The present invention relates to semiconductor devices, and particularly to a technique that can simultaneously solve problems related to the element isolation, i.e. formation of voids, impurity diffusion from a doped insulator into the semiconductor substrate etc., and thickness reduction of the gate insulating film caused by silicon nitride film.

2. Description of the Background Art

Element isolation having isolation regions are necessary in order to eliminate electrical interference among elements in semiconductor integrated circuits so that individual elements can perfectly independently operate.

Methods for forming element isolation regions include the well-known trench isolation method, for which many improvements have been suggested. In the trench isolation, trenches are formed in a substrate and filled with insulation. Since the trench isolation is almost free from bird's beaks, it is an isolation method indispensable for miniaturization of semiconductor integrated circuits.

A conventional semiconductor device 500 is now described referring to the cross-sectional view of FIG. 63. The semiconductor device 500 has a silicon substrate 501, trench-type element isolation structures 531, and MOSFETs (Metal Oxide Semiconductor Field Effect Transistors) 590.

Trenches 502 are formed into the substrate 501 from the substrate's main surface 501S and element isolation structures 531 are disposed inside the trenches 502. The conventional element isolation structure 531 is formed of a silicon oxide film or an inner-wall oxide film 531a and a silicon oxide film or a buried oxide film 531b. The inner-wall oxide film 531a is formed along the inner surface of the trench 502 and is entirely in contact with this inner surface. The buried oxide film 531b resides in contact with the inner-wall oxide film 531a to fill the trench 502.

MOSFETs 590 are formed in the active regions or element formation regions that are sectioned by the element isolation structures 531. More specifically, in an active region, a pair of source/drain regions 593 are formed in the substrate's main surface 501S, with a channel region interposed therebetween, and a gate insulating film 592 of silicon oxide and a gate electrode 591 are formed in this order on the substrate's main surface 501S or above the channel region.

Next, a method for manufacturing the conventional semiconductor device 500 is now described referring to the cross-sectional views of FIGS. 64 to 67. First, an underlying silicon oxide film 505 and a silicon nitride film 506 are formed in this order on the substrate's main surface 501S (see FIG. 64). Then the films 505, 506 and the substrate 501 are pattern-etched by photolithography to form the trenches 502 in the substrate 501 (see FIG. 64).

Next, the inner surfaces of the substrate 501 that are exposed within the trenches 502 are thermally oxidized to form the inner-wall oxide film 531a (see FIG. 65). Subsequently, the buried oxide film 531b is deposited over the entire surface by CVD (Chemical Vapor Deposition) method so that the trenches 502 are filled with the buried oxide film 531b (see FIG. 65).

Then the portion of the buried oxide film 531b above the silicon nitride film 506 is removed by CMP (Chemical Mechanical Polishing) method using the silicon nitride film 506 as a stopper, so as to make the buried oxide film 531b flat (see FIG. 66). Subsequently, the buried oxide film 531b is partially removed with hydrofluoric acid (HF) to adjust the height of the element isolation structures 531. Then the silicon nitride film 506 is removed with thermal phosphoric acid and the underlying silicon oxide film 505 is removed with hydrofluoric acid. The element isolation structures 531 are thus completed (see FIG. 67).

The MOSFETs 590 are formed after that. Specifically, wells, channel-cut regions, and channel impurity layers for controlling the threshold are formed by ion implantation, which is followed by the formation of the gate insulating film 592, gate electrodes 591, and source/drain regions 593. The semiconductor device 500 shown in FIG. 63 is thus completed.

A technique about trench isolation is described in the following patent specification 1, for example.

Patent Specification 1: Japanese Patent Application Laid-Open No. 2000-332099.

In the manufacturing method of the semiconductor device 500 shown above, the buried oxide film 531b is deposited in the trenches 502 by CVD. Accordingly, voids are likely to form in the buried oxide film 531b as the aspect ratio of the trenches 502 becomes larger with miniaturization of the semiconductor device 500. Such voids appear as fine grooves in the surfaces of the element isolation structures 531 after the CMP or after the HF treatment of the silicon oxide film 531b and/or 505. When interconnection layer material, for example, is buried in these fine grooves and it remains after the interconnection material has been patterned, then the interconnection layer will be short-circuited. The formation of voids thus reduces the yield.

The void formation can be effectively suppressed by forming the buried oxide film 531b with a silicon oxide film that is doped with impurities and has an improved property to completely fill trenches without voids. However, by thermal process following the formation of the buried oxide film 531b, impurities in the buried oxide film 531b will diffuse into the substrate 501 or an interconnection layer on the element isolation structures 531, causing problems such as variations of characteristics of the MOSFETs 590. Specifically, impurities diffused into the interfaces between the element isolation structures 531 and the substrate 501 or into the substrate 501 will vary the threshold voltage of the MOSFETs 590 or vary the oxidation rate during the formation of the gate insulating film 592. Moreover, when impurities diffused into the substrate 501 form an interface energy state at the interface between the substrate 501 and the gate insulating film 592, then characteristics of the MOSFETs 590 may vary or leakage current may increase. Also, when the impurities diffuse into the gate electrodes 591 extending on the element isolation structures 531, then the work function of the gate electrodes 591 will vary to vary characteristics of the MOSFETs 590.

The above-mentioned patent specification 1 (Japanese Patent Application Laid-Open No. 2000-332099) discloses a technique for suppressing such impurity diffusion by forming a two-layered inner-wall structure, where a silicon nitride film is deposited between the inner-wall oxide film 531a and the buried oxide film 531b. However, depositing a silicon nitride film enlarges the aspect ratio of the trenches 502, and then voids are likely to form during the formation of the buried oxide film 531b. Moreover, silicon nitride film, which suppresses oxidation during the formation of the gate oxide film 592, causes the gate insulating film 592 to form thinner near the element isolation structures 531, which lowers the reliability of the gate insulating film 592.

SUMMARY OF THE INVENTION

The present invention has been made in consideration of the problems shown above, and an object of the invention is to provide a semiconductor device that can simultaneously solve problems related to the element isolation, i.e. formation of voids, impurity diffusion from a doped insulator into the semiconductor substrate etc., and thickness reduction of the gate insulating film caused by silicon nitride film.

According to a first aspect of the invention, a semiconductor device includes a semiconductor substrate, a doped insulator doped with impurities, an undoped insulator which is not doped with impurities, a first oxynitride film, and an MIS-type transistor. The semiconductor substrate has a main surface and a trench whose entrance is formed in the main surface. The doped insulator is disposed in the trench. The undoped insulator is disposed in the trench and positioned opposite to the bottom surface of the trench with the doped insulator interposed therebetween. The first oxynitride film is disposed in the trench between the doped insulator and the semiconductor substrate and between the undoped insulator and the semiconductor substrate. The MIS-type transistor is disposed in an area on the main surface of the semiconductor substrate where the trench is absent. The doped insulator is isolated from the semiconductor substrate by the undoped insulator and the first oxynitride film.

According to a second aspect of the invention, a semiconductor device includes a semiconductor substrate, a doped insulator doped with impurities, an undoped insulator which is not doped with impurities, a silicon oxide film, an oxynitride film, and an MIS-type transistor. The semiconductor substrate has a main surface and a trench whose entrance is formed in the main surface. The doped insulator is disposed in the trench. The undoped insulator is disposed in the trench and positioned opposite to the bottom surface of the trench with the doped insulator interposed therebetween. The silicon oxide film is disposed in the trench between the doped insulator and the semiconductor substrate. The oxynitride film is disposed in the trench between the undoped insulator and the semiconductor substrate and between the undoped insulator and the doped insulator. The MIS-type transistor is disposed in an area on the main surface of the semiconductor substrate where the trench is absent. The doped insulator is isolated from the semiconductor substrate by the silicon oxide film, the undoped insulator, and the oxynitride film.

The doped insulator has an improved gap-filling property and can reduce the aspect ratio of the trench, which suppresses formation of voids in the element isolation structure. Moreover, the doped insulator is isolated from the semiconductor substrate by the undoped insulator and the first oxynitride film or by the silicon oxide film, the undoped insulator, and the oxynitride film. It is therefore possible to prevent impurity diffusion from the doped insulator into the semiconductor substrate or into components on the element isolation structure (e.g. gate electrodes). Furthermore, forming the oxynitride film by a nitridation process utilizing the oxide film (e.g. thermal nitridation or plasma nitridation process) avoids a considerable increase of the trench aspect ratio and thus suppresses void formation in the element isolation structure. Also, unlike silicon nitride film, the oxynitride film avoids thickness reduction of the gate insulating film to enhance the reliability of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
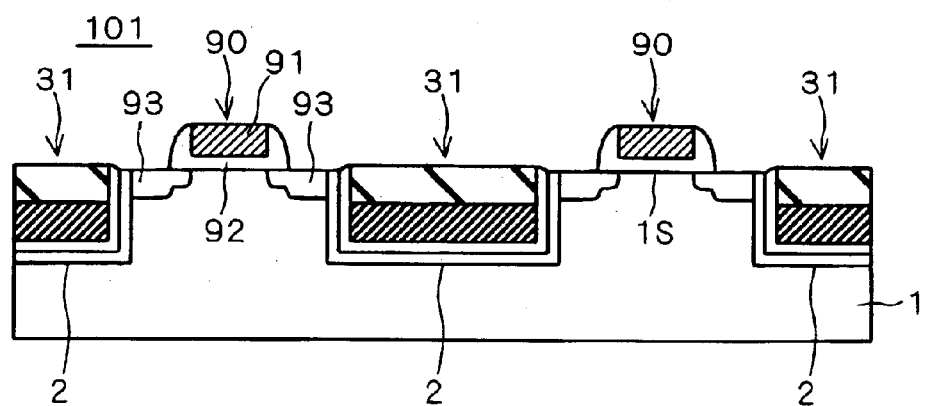
FIG. 1 is a cross-sectional view used to describe a semiconductor device according to a first preferred embodiment.
Figure 2:
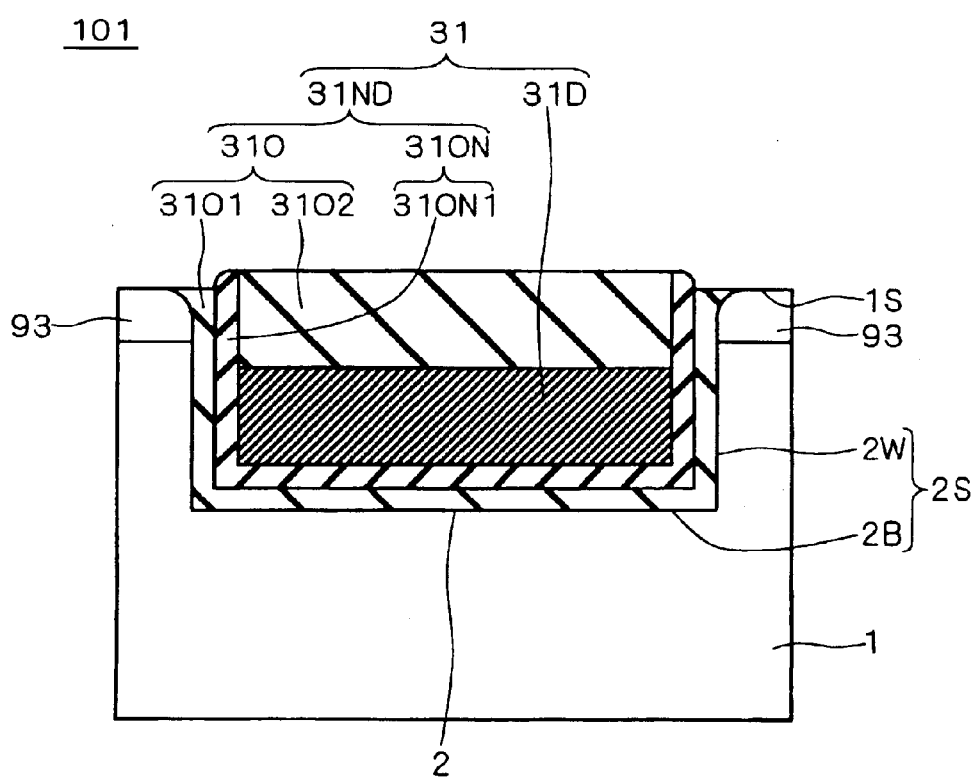
FIG. 2 is a cross-sectional view used to describe the trench-type element isolation in the semiconductor device of the first preferred embodiment.
Figure 3:
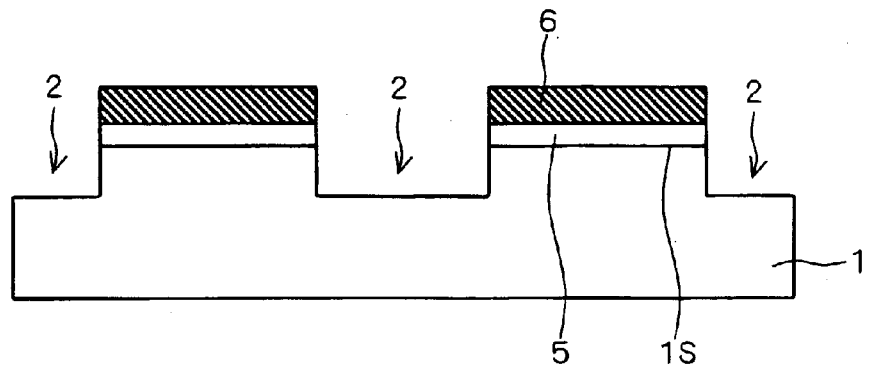
FIGS. 3 to 8 are cross-sectional views used to describe a method for manufacturing the semiconductor device of the first preferred embodiment.

FIG. 1 is a schematic cross-sectional view of a semiconductor device 101 according to a first preferred embodiment and FIG. 2 is a cross-sectional view used to describe trench-type element isolation structures 31 in the semiconductor device 101. The semiconductor device 101 includes a semiconductor substrate 1 of, e.g. silicon (which may be referred to simply as a substrate hereinafter), element isolation structures 31, and semiconductor elements (herein, MOSFETs (or MISFETs (Metal Insulator Semiconductor Field Effect Transistors) 90 are shown by way of example).

Specifically, trenches 2 having a depth of about 150 nm to 500 nm are formed into the substrate 1 from the substrate's main surface 1S (the entrances of the trenches 2 are formed in the substrate's main surface 1S), with the element isolation structures 31 disposed in the trenches 2.

As shown in FIG. 2, the element isolation structure 31 can be divided roughly into a doped insulator 31D that is doped with impurities (herein, by way of example, a silicon oxide film doped with fluorine) and a peripheral insulator 31ND that is not doped with impurities. The peripheral insulator 31ND is in contact with the doped insulator 31D and entirely surrounds the insulator 31D. The peripheral insulator 31ND can further be divided roughly into an oxide portion 31O formed of silicon oxide and an oxynitride portion 31ON formed of silicon oxynitride; thus the peripheral insulator 31ND does not include any silicon nitride film. In the element isolation structure 31, the oxide portion 31O includes two silicon oxide films 31O1 and 31O2 and the oxynitride portion 31ON includes an oxynitride film 31ON1.

More specifically, the silicon oxide film 31O1 is formed along the inner surface 2S of the trench 2 (the side surfaces 2W and the bottom surface 2B) and is entirely in contact with this inner surface 2S; the silicon oxide film 31O1 is thus U-shaped in cross-section. The silicon oxide film 31O1 has a thickness (the dimension perpendicular to the inner surface 2S) of about 5 nm to 30 nm.

The oxynitride film 31ON1 is formed in the trench 2 to face the substrate 1 with the silicon oxide film 31O1 interposed between the oxynitride film 31ON1 and the substrate 1. The oxynitride film 31ON1 is formed along the silicon oxide film 31O1 and is in contact with this film 31O1, so that it is also U-shaped in cross-section. The oxynitride film 31ON1 has portions that face the side surfaces 2W of the trench 2 with the silicon oxide film 31O1 interposed therebetween. As will be described later, the oxynitride film 31ON1 is formed by nitridation utilizing the silicon oxide film 31O1 included in the oxide portion 31O. The oxynitride film 31ON1 has a thickness (the dimension perpendicular to the inner surface 2S of the trench 2) of about 0.5 nm to 2 nm.

Further, the doped silicon oxide film 31D and the silicon oxide film (or undoped insulator) 31O2, which is a part of the oxide portion 31O, are formed in the trench 2 to face the substrate 1 with the oxynitride film 31ON1 and the silicon oxide film 31O1 interposed between these films 31D, 31O2 and the substrate 1. In other words, in the trench 2, the oxynitride film 31ON1 and the silicon oxide film 31O1 are positioned between the doped silicon oxide film 31D and the substrate 1 and between the silicon oxide film 31O2 and the substrate 1, and the silicon oxide film 31O1 is positioned between the oxynitride film 31ON1 and the substrate 1. It is assumed herein that the two films 31D and 31O2 are approximately equal in thickness (the dimension perpendicular to the bottom surface 2B of the trench 2 or to the substrate's main surface 1S).

More specifically, the two films 31D and 31O2 form a two-layered structure within the trench 2. That is, the doped silicon oxide film 31D is located closer to the bottom surface 2B of the trench 2 and its bottom surface and side surfaces (that face toward the bottom surface 2B and side surface 2W of the trench 2) are in contact with the oxynitride film 31ON1. On the other hand, the silicon oxide film 31O2 is located closer to the entrance of the trench 2 than the doped silicon oxide film 31D (accordingly the silicon oxide film 31O2 is positioned opposite to the bottom surface 2B of the trench 2 with the doped silicon oxide film 31D interposed therebetween). The bottom surface of the silicon oxide film 31O2 (its surface that faces toward the bottom surface 2B of the trench 2) is in contact with the doped silicon oxide film 31D and its side surfaces (that face toward the side surfaces 2W of the trench 2) are in contact with the oxynitride film 31ON1. That is to say, the entire surface of the doped silicon oxide film 31D is in contact with the silicon oxide film 31O2 and the oxynitride film 31ON1, and the doped silicon oxide film 31D is isolated from the substrate 1 by the silicon oxide films 31O1 and 31O2 and the oxynitride film 31ON1.

In the vicinity of the entrance of the trench 2, the silicon oxide film 31O1, oxynitride film 31ON1, and silicon oxide film 31O2 are arranged in this order from the side surface 2W of the trench 2 or from the edges of the entrance; the space near the entrance of the trench 2 is thus filled with these films 31O1, 31ON1 and 31O2, i.e. with the oxide portion 31O and the oxynitride portion 31ON. That is, no silicon nitride film is present in the vicinity of the entrance of the opening.

Further, in the vicinity of the entrance of the trench 2, the ends of the silicon oxide film 31O1 are approximately at the same level as the substrate's main surface 1S, and the ends of the oxynitride film 31ON1 protrude above the substrate's main surface 1S or from the trench 2, and the top surface of the silicon oxide film 31O2 (its surface opposite to the surface that is in contact with the doped silicon oxide film 31D) is approximately at the same level as the ends of the oxynitride film 31ON1. That is to say, the element isolation structure 31 has no recess that is lower than the substrate's main surface 1S. Also, the entrance edges of the trench 2, or of the substrate 1, are rounded. In correspondence with the rounded shape, in the vicinity of the entrance edges, the thickness of the silicon oxide film 31O1 gradually increases toward its ends.

Referring to FIG. 1 again, MOSFETs 90 are formed in the active regions or element formation regions that are sectioned by the element isolation structures 31 (the areas on the main surface 1S where the trenches 2 are absent). More specifically, in an active region, a pair of source/drain regions 93 are formed in the substrate's main surface 1S, with a channel region between. The source/drain regions 93 are in contact with the element isolation structures 31 and are shallower than the element isolation structures 31 (shallower than the silicon oxide film 31O2 herein). A gate insulating film 92, e.g. of silicon oxide, and a gate electrode 91 are formed in this order on the substrate's main surface 1S and face the channel region.

Next, referring to FIGS. 1 and 2 and the cross-sectional views of FIGS. 3 to 8, a method for manufacturing the semiconductor device 101 is now described. First, an underlying silicon oxide film 5 having a thickness of about 5 nm to 30 nm and a silicon nitride film 6 having a thickness of about 50 nm to 200 nm are formed in this order on the substrate's main surface 1S (see FIG. 3). Then these films 5, 6 and the substrate 1 are pattern-etched by photolithography to form the trenches 2 into the substrate 1 (see FIG. 3). The trenches 2 are formed to a depth of about 150 nm to 500 nm in the substrate 1.

Subsequently, the inner surfaces 2S of the substrate 1, which are exposed in the trenches 2, are thermally oxidized to form the silicon oxide film 31O1 with a thickness of about 5 nm to 30 nm (see FIG. 4). At this time, the ends of the silicon oxide film 31O1 are coupled with the underlying silicon oxide film 5 (or are in contact with it). Or it can also be said that the two films 31O1 and 5 share the ends. During this thermal oxidation process, the portions of the substrate 1 in the vicinity of the parts where the two silicon oxide films 31O1 and 5 join, i.e. the entrance edges, are oxidized and therefore rounded (see FIG. 2).

Figure 4:
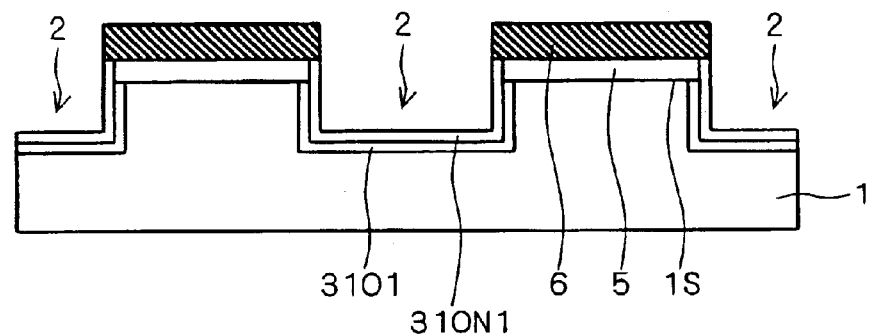

Next, a nitridation process, specifically a plasma process in an atmosphere (gas) containing nitrogen, is performed, whereby, by using the silicon oxide film 31O1, the oxynitride film 31ON1 is formed in the surface of the silicon oxide film 31O1 (see FIG. 4). This nitridation forms the oxynitride film 31ON1 in contact with the silicon oxide film 31O1, and portions of the oxynitride film 31ON1 face to the side surfaces 2W of the trench 2. During this process, the oxynitride film 31ON1 is formed also on the side surfaces of the underlying silicon oxide film 5 (which are exposed within the trenches 2).

Figure 5:
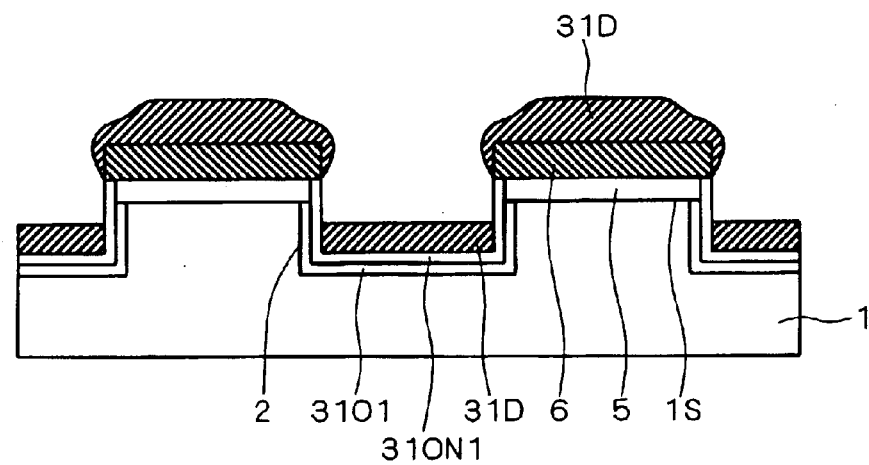

Subsequently, fluorine-doped silicon oxide film 31D is deposited in the trenches 2 by HDP-CVD (High Density Plasma-Chemical Vapor Deposition: see FIG. 5) method. For this process, conditions for the film formation are selected so that, as shown in FIG. 5, the doped silicon oxide film 31D will not be deposited on the oxynitride film 31ON1 in the vicinities of the entrances of the trenches 2, in other words, so that the oxynitride film 31ON1 will remain exposed in the vicinities of the entrances, or so that the film 31D will not be U-shaped in cross-section in the trenches 2. The doped silicon oxide film 31D is deposited also on the top surfaces of the silicon nitride film 6 (the surfaces opposite to the surfaces that are in contact with the underlying silicon oxide film 5); in the example shown FIG. 5, the doped silicon oxide film 31D is deposited further on the side surfaces of the film 6).

Figure 6:
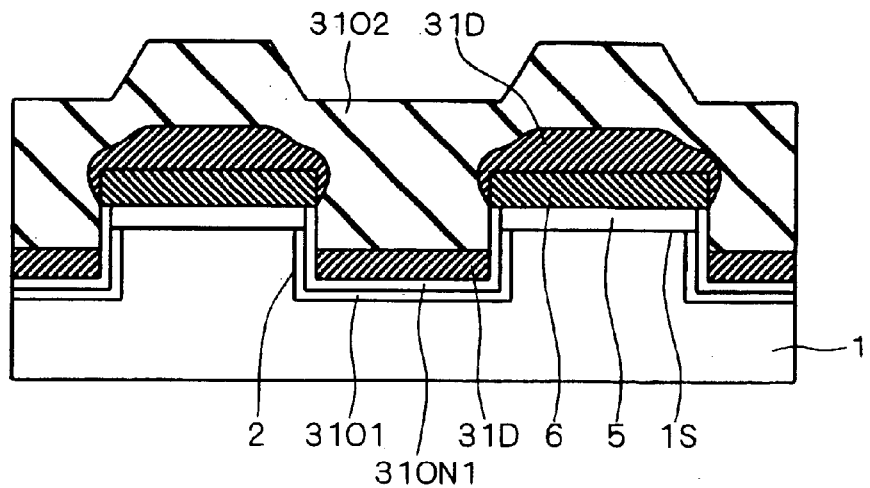

Next, the silicon oxide film 31O2, part of the oxide portion 31O, is deposited over the entire surface by HDP-CVD (so that it at least covers the doped silicon oxide film 31D in the trenches 2 and so that it fills the trenches 2), whereby the trenches 2 are filled completely (see FIG. 6).

Figure 7:
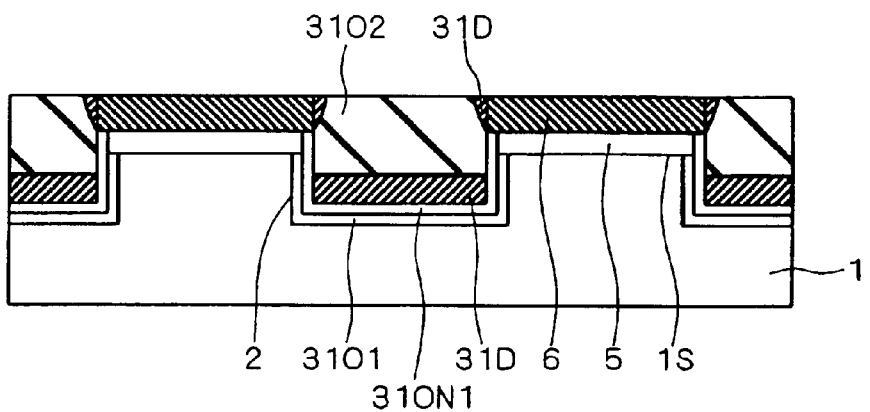

Then, by CMP (Chemical Mechanical Polishing) method using the silicon nitride film 6 as a stopper, the portions of the films 31D and 31O2 above the silicon nitride film 6 are removed, whereby the silicon oxide film 31O2 is made flat (see FIG. 7). Subsequently, the silicon oxide film 31O2 is partially removed with hydrofluoric (HF) acid to adjust the height of the element isolation structures 31. The silicon nitride film 6 is then removed with thermal phosphoric acid and the underlying silicon oxide film 5 is removed with hydrofluoric acid.

Since the silicon oxide film 31O2 is partially removed during the removal of the underlying silicon oxide film 5, the process of partially removing the silicon oxide film 31O2, which precedes the removal of the silicon nitride film 6, is performed considering the amount of the removal. The portions of the doped silicon oxide film 31D that remain on the side surfaces of the silicon nitride film 6 are removed during the etching of the silicon oxide film 31O2 and/or the underlying silicon oxide film 5. As mentioned above, the oxynitride film 31ON1 has been formed also in the side surfaces of the underlying silicon oxide film 5. Accordingly, after the removal of the underlying silicon oxide film 5, the ends of the oxynitride film 31ON1 protrude above the substrate's main surface 1S, while the ends of the silicon oxide film 31O1 are positioned approximately at the same height as the substrate's main surface 1S.

Figure 8:
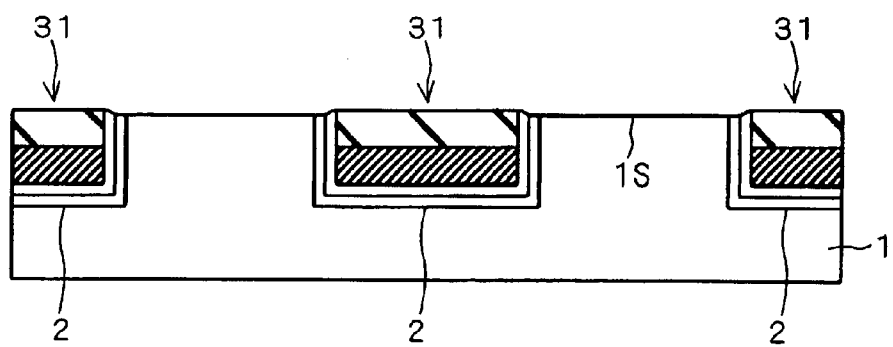

Thus the element isolation structures 31 are completed (see FIG. 8). According to this manufacturing method, the silicon oxide film 31O1 and the oxynitride film 31ON1 are interposed between the substrate 1 and the doped silicon oxide film 31D, and the silicon oxide film 31O2 is positioned closer to the entrance of the trench 2 than the doped silicon oxide film 31D. Furthermore, within trench 2, the substrate 1, the silicon oxide film 31O1 and the oxynitride film 31ON1 are formed in contact and the silicon oxide film 31O2 is formed in contact with the portions of the oxynitride film 31ON1 that are exposed in the vicinity of the entrance of the opening, and thus the space near the entrance is occupied by the silicon oxide films 31O1, 31O2 and the oxynitride film 31ON1. Also, the doped silicon oxide film 31D is surrounded by the peripheral insulator 31ND through the formation of the silicon oxide films 31O1 and 31O2 and the oxynitride film 31ON1.

The MOSFETs 90 are then formed. Specifically, wells, channel-cut regions, and channel impurity layers for controlling the threshold are formed by ion implantation. Next, the gate insulating films 92 are formed and the gate electrodes 91 are formed by depositing and patterning electrode material. Next, the source/drain regions 93 are formed by ion implantation. Thus the semiconductor device 101 of FIG. 1 is completed.

The semiconductor device 101 and its manufacturing method provide the following effects.

First, because the doped silicon oxide film 31D has an improved property to fill the trenches 2, it is possible to suppress void formation even inside narrow trenches 2. Furthermore, because the doped silicon oxide film 31D is positioned under the silicon oxide film 31O2, the aspect ratio of the trenches 2 is smaller after the formation of the doped silicon oxide film 31D. This suppresses void formation during the process of burying the silicon oxide film 31O2 that is not doped with impurities, thus alleviating problems due to voids.

Moreover, because the peripheral insulator 31ND surrounds the doped silicon oxide film 31D, it is possible to prevent impurity diffusion into the substrate 1 and gate electrodes 91. Specifically, the oxynitride film 31ON1 and the silicon oxide film 31O1 prevent impurity diffusion from the doped silicon oxide film 31D into the substrate 1, and the silicon oxide films 31O1, 31O2 and the oxynitride film 31ON1 prevent impurity diffusion into the vicinities of the substrate's main surface 1S (e.g. into the source/drain regions 93) and into components on the element isolation structures 31 (e.g. the gate electrodes 91). It is thus possible to alleviate problems caused by the impurities, such as variations of characteristics of the MOSFETs 90 and leakage current. At this time, since oxynitride has a higher capability than silicon oxide to prevent impurity diffusion, the oxynitride film 31ON1 can more reliably prevent impurity diffusion into the substrate 1 (including areas near the substrate's main surface 1S).

The oxynitride film 31ON1 is formed through a nitridation process utilizing the silicon oxide film 31O1. As compared with deposition methods like CVD, such nitridation process can form a thinner film and provide more uniform film thickness even in the trenches 2, so that the oxynitride film 31ON1 can be formed without considerably increasing the aspect ratio of the trenches 2. This suppresses void formation in the element isolation structures 31 and hence alleviates problems caused by voids.

Also, the application of the oxynitride portion 31ON provides the following effects that would not be obtained when silicon nitride film is used. That is to say, the space in the vicinity of the entrance of the opening is filled with the oxide portion 31O and the oxynitride portion 31ON and no silicon nitride film is present near the entrance. As stated before, when silicon nitride film is present near the entrance, it will suppress oxidation during the process in which the gate insulating film 92 is formed by oxidizing the substrate's main surface 1S. This causes the gate insulating film 92 to form thinner near the element isolation structures, which lowers the reliability of the gate insulating film 92. However, in the semiconductor device 101, because no silicon nitride film is present near the entrance of the opening, and also because oxynitride is less likely than silicon nitride to cause the gate insulating film to form thinner, the reliability of the gate insulating film 92, and hence the reliability of the semiconductor device 101, can be improved.

Figure 9:
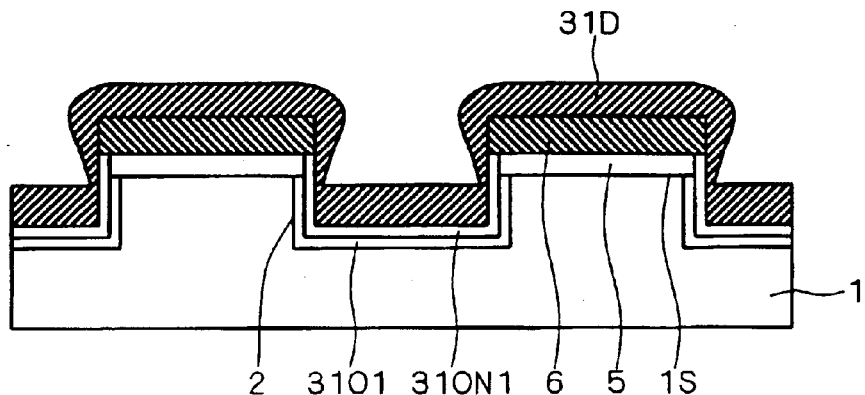
FIGS. 9 to 12 are cross-sectional views used to describe another method for manufacturing the semiconductor device of the first preferred embodiment.

Now, another, a second method for manufacturing the semiconductor device 101 is described referring to FIGS. 9 to 12. First, the above-described manufacturing steps are performed to the formation of the oxynitride film 31ON1. Subsequently, the fluorine-doped silicon oxide film 31D (or an insulating film for it) is deposited into the trenches 2 by HDP-CVD (see FIG. 9). At this time, the doped silicon oxide film 31D is deposited to a thickness larger than its thickness in the completed element isolation structures 31. As shown in FIG. 9, unlike in the above-described manufacturing method, the doped silicon oxide film 31D may be deposited on the oxynitride film 31ON1 in the vicinities of the entrances of the trenches 2; that is, the film 31D may be U-shaped in cross-section in the trenches 2. Also, the doped silicon oxide film 31D may be formed continuously over the trenches 2 and the top surfaces of the silicon nitride film 6.

Figure 10:
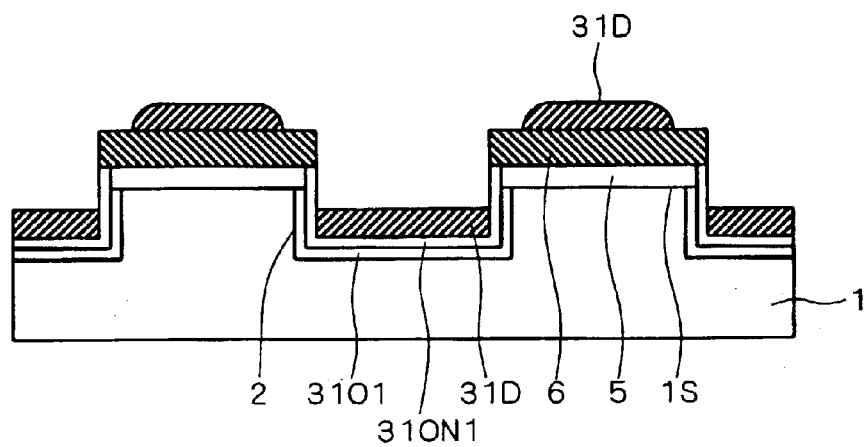
Figure 11:
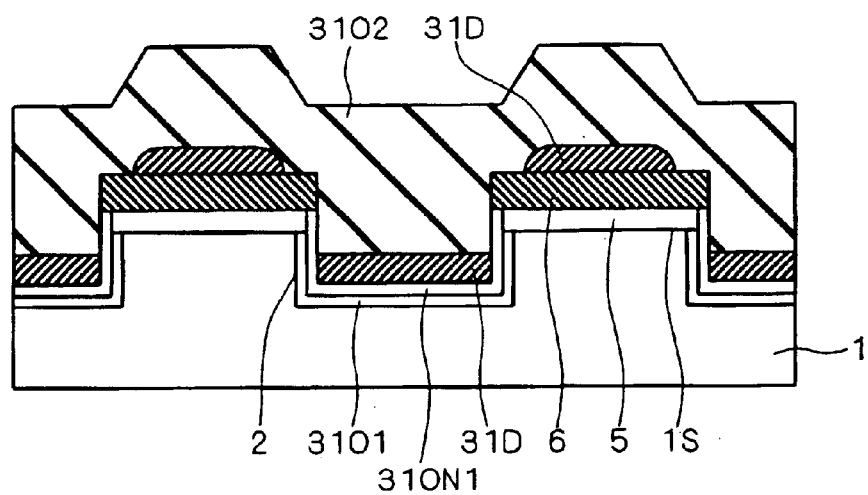
Figure 12:
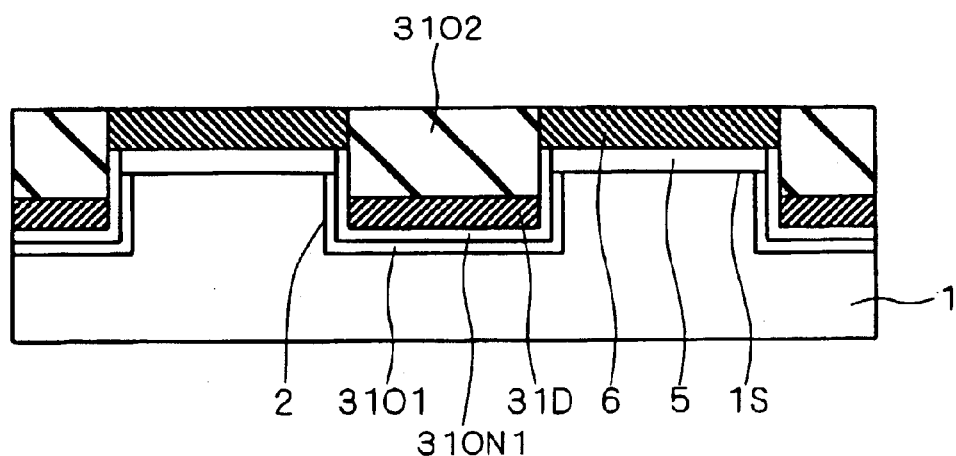

Next, part of the deposited silicon oxide film 31D is removed with hydrofluoric acid (see FIG. 10). Specifically, the top surface of the doped silicon oxide film 31D is etched to adjust the size (thickness) of the film 31D, whereby the silicon oxide film 31D in the trenches 2 is formed as that in the completed element isolation structures 31. The HF treatment is performed so that the oxynitride film 31ON1 will be exposed in the vicinities of the entrances of the openings. The portions of the silicon oxide film 31D that are located on the side surfaces of the silicon nitride film 6 are also removed (preferably, completely removed) to enlarge the entrances that have been narrowed by these portions. At this time, in trench 2, the oxynitride film 31ON1, located closer to the doped silicon oxide film 31D than the silicon oxide film 31O1, prevents the silicon oxide film 31O1 from being etched during the HF treatment (protects it from HF).

Subsequently, in the manner shown in the above-described manufacturing method, the silicon oxide film 31O2 is deposited (see FIG. 11) and subsequent processes, such as CMP (see FIG. 12), are applied so as to complete the semiconductor device 101. As stated above, the entrances of the openings have been enlarged by the HF treatment to the doped silicon oxide film 31D, so that the silicon oxide film 31O2 can be deposited satisfactorily, while suppressing void formation.

Second Preferred Embodiment

Figure 13:
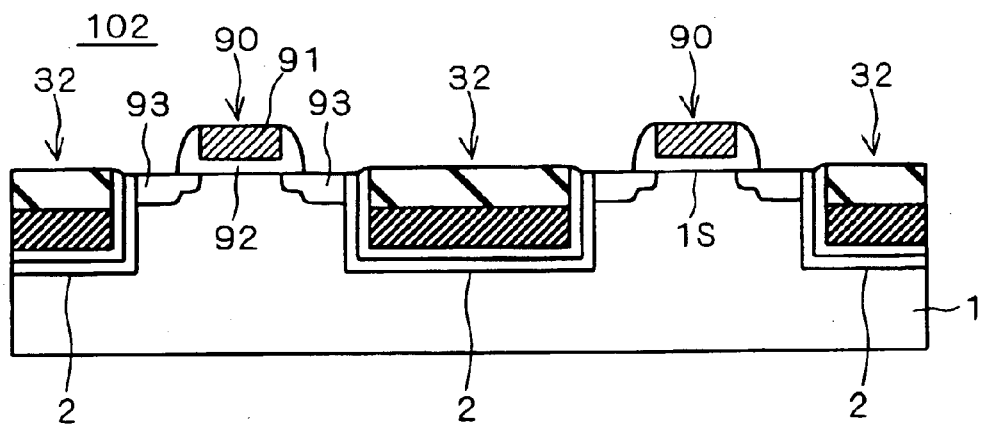
FIG. 13 is a cross-sectional view used to describe a semiconductor device according to a second preferred embodiment.
Figure 14:
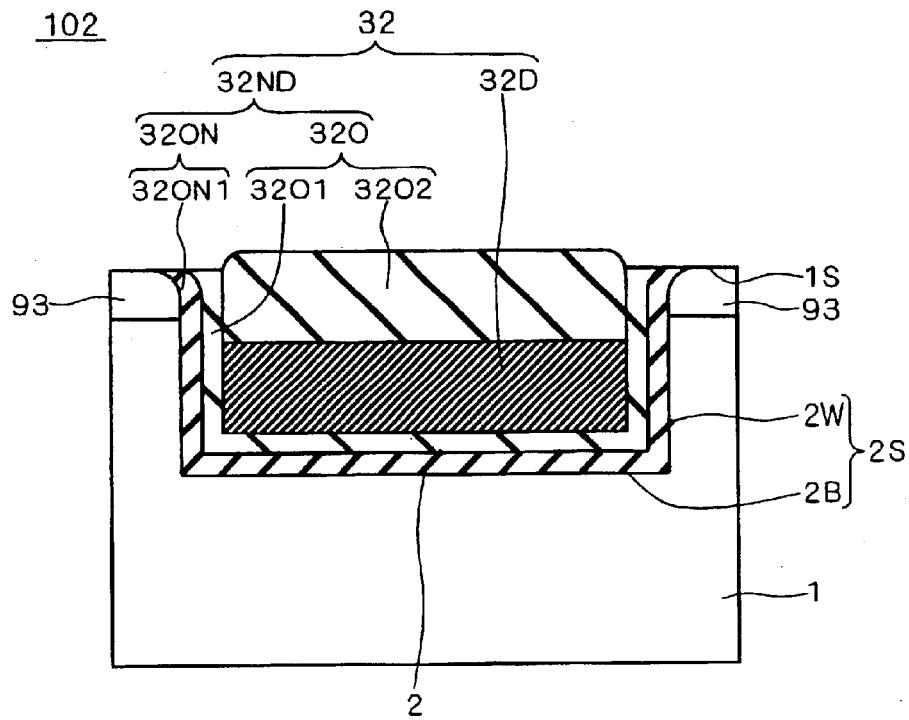
FIG. 14 is a cross-sectional view used to describe the trench-type element isolation in the semiconductor device of the second preferred embodiment.

FIG. 13 is a schematic cross-sectional view of a semiconductor device 102 according to a second preferred embodiment and FIG. 14 is a cross-sectional view used to describe trench-type element isolation structures 32 in the semiconductor device 102. In the semiconductor device 102, the element isolation structures 31 provided in the semiconductor device 101 (see FIGS. 1 and 2) are replaced by element isolation structures 32, where, basically, the silicon oxide film 31O1 and the oxynitride film 31ON1 in the element isolation structures 31 (see FIG. 2) are reversed in position.

Specifically, the element isolation structures 32 are disposed within the trenches 2 in the substrate 1. As shown in FIG. 14, the element isolation structure 32 can be divided roughly into a doped insulator 32D that is doped with impurities (herein, by way of example, a silicon oxide film doped with fluorine) and a peripheral insulator 32ND that is not doped with impurities. The peripheral insulator 32ND is in contact with the doped insulator 32D and entirely surrounds the insulator 32D. The peripheral insulator 32ND can further be divided roughly into an oxide portion 32O formed of silicon oxide and an oxynitride portion 32ON formed of silicon oxynitride; thus the peripheral insulator 32ND does not include any silicon nitride film. In the element isolation structure 32, the oxide portion 32O includes two silicon oxide films 32O1 and 32O2 and the oxynitride portion 32ON includes an oxynitride film 32ON1.

More specifically, the oxynitride film 32ON1 is formed along the inner surface 2S of the trench 2 and is entirely in contact with this inner surface 2S, so that it is U-shaped in cross-section. The oxynitride film 32ON1 has portions that face to the side surfaces 2W of the trench 2. As will be described later, the oxynitride film 32ON1 is formed by nitridation utilizing the silicon oxide film 32O1 included in the oxide portion 32O. The oxynitride film 32ON1 has about the same thickness as the oxynitride film 31ON1 described earlier (see FIG. 2).

The silicon oxide film 32O1 is formed in the trench 2 to face the substrate 1 with the oxynitride film 32ON1 interposed between the silicon oxide film 32O1 and the substrate 1. The silicon oxide film 32O1 is formed along the oxynitride film 32ON1 and is in contact with the film 32ON1; the silicon oxide film 32O1 is thus also U-shaped in cross-section. The silicon oxide film 32O1 has about the same thickness as the silicon oxide film 31O1 described earlier (see FIG. 2).

Further, the doped silicon oxide film 32D and the silicon oxide film (or undoped insulator) 32O2, which is a part of the oxide portion 32O, are formed in the trench 2 to face the substrate 1 with the silicon oxide film 32O1 and the oxynitride film 32ON1 interposed between these films 32D and 32O2 and the substrate 1. In other words, in the trench 2, the silicon oxide film 32O1 and the oxynitride film 32ON1 are positioned between the doped silicon oxide film 32D and the substrate 1 and between the silicon oxide film 32O2 and the substrate 1. It is assumed herein that the two films 32D and 32O2 have approximately the same thickness, like the films 31D and 31O2 described earlier (see FIG. 2).

More specifically, the two films 32D and 32O2 form a two-layered structure within the trench 2. That is, the doped silicon oxide film 32D is located closer to the bottom surface 2B of the trench 2 and its bottom surface and side surfaces are in contact with the silicon oxide film 32O1. On the other hand, the silicon oxide film 32O2 is located closer to the entrance of the trench 2 than the doped silicon oxide film 32D (accordingly the silicon oxide film 32O2 is positioned opposite to the bottom surface 2B of the trench 2 with the doped silicon oxide film 32D interposed therebetween). The bottom surface of the silicon oxide film 32O2 is in contact with the doped silicon oxide film 32D and its side surfaces are in contact with the silicon oxide film 32O1. That is to say, the entire surface of the doped silicon oxide film 32D is in contact with the silicon oxide films 32O1 and 32O2, and the doped silicon oxide film 32D is isolated from the substrate 1 by the silicon oxide films 32O1 and 32O2 and the oxynitride film 32ON1.

In the vicinity of the entrance of the trench 2, the oxynitride film 32ON1, the silicon oxide film 32O1, and the silicon oxide film 32O2 are arranged in this order from the side surfaces 2W of the trench 2 or from the edges of the entrance; the space near the entrance of the trench 2 is thus filled with these films 32ON1, 32O1 and 32O2, i.e. with the oxide portion 32O and the oxynitride portion 32ON. That is, no silicon nitride film is present in the vicinity of the entrance of the opening.

Further, in the vicinity of the entrance of the trench 2, the ends of the oxynitride film 32ON1 and the silicon oxide film 32O1 are at approximately the same level as the substrate's main surface 1S, and the top surface of the silicon oxide film 32O2 protrudes above the substrate's main surface 1S or from the trench 2. That is to say, the element isolation structure 32 has no recess that is lower than the substrate's main surface 1S. Also, the entrance edges of the trench 2, or of the substrate 1, are rounded, and the oxynitride film 32ON1 is formed along this rounded shape (its thickness is approximately uniform). In correspondence with this rounded shape, the ends of the silicon oxide film 32O1 are shaped like those of the silicon oxide film 31O1 described before (see FIG. 2).

As in the semiconductor device 101 (see FIG. 1), MOSFETs 90 are formed in the active regions or element formation regions that are sectioned by the element isolation structures 32.

Next, referring to FIGS. 13 and 14 and the cross-sectional views of FIGS. 15 to 19, a method for manufacturing the semiconductor device 102 is now described. First, as in the manufacturing method of the semiconductor device 101, the underlying silicon oxide film 5 and the silicon nitride film 6 are formed and then the trenches 2 are formed into the substrate 1 (see FIG. 15). Next, as in the manufacturing method of the semiconductor device 101, the inner surfaces 2S of the substrate 1, exposed within the trenches 2, are thermally oxidized to form the silicon oxide film 32O1 (see FIG. 15).

Figure 15:
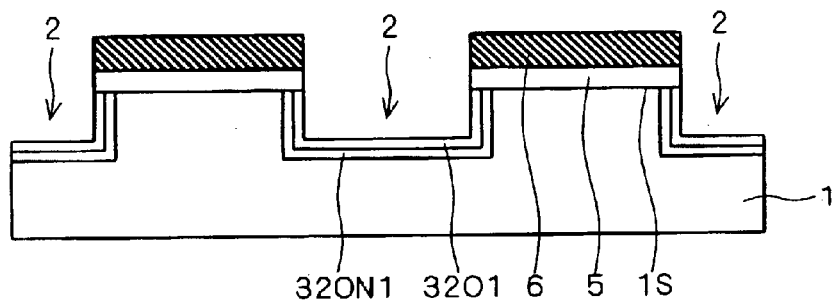
FIGS. 15 to 19 are cross-sectional views used to describe a method for manufacturing the semiconductor device of the second preferred embodiment.
Figure 16:
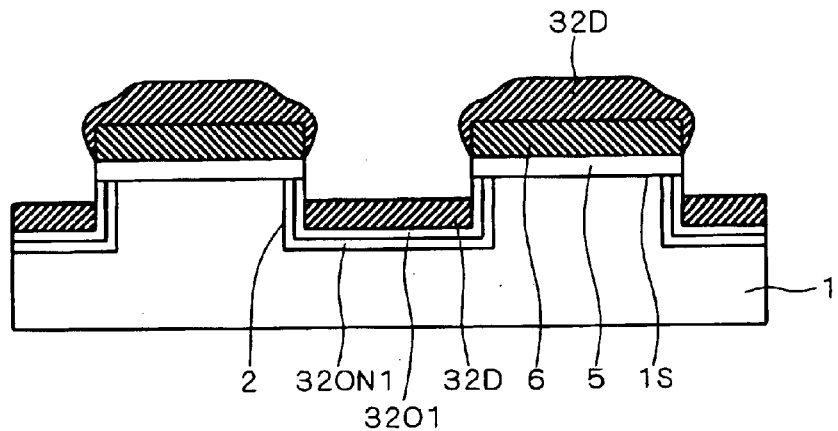
Figure 17:
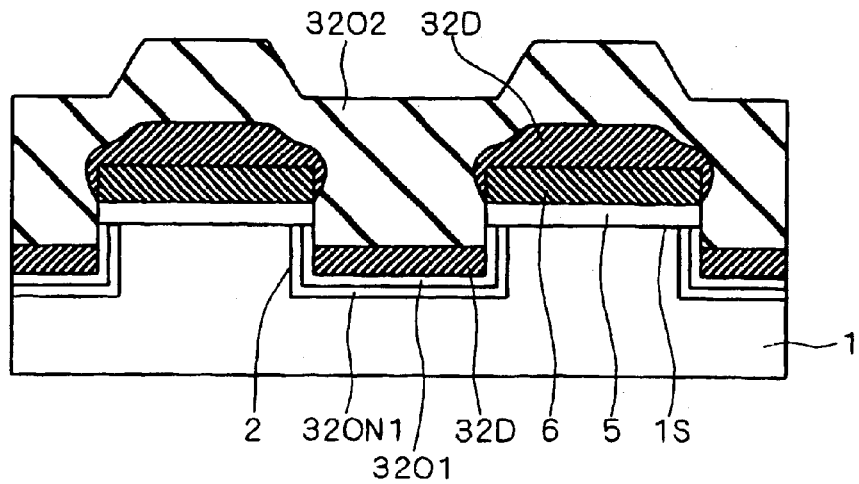
Figure 18:
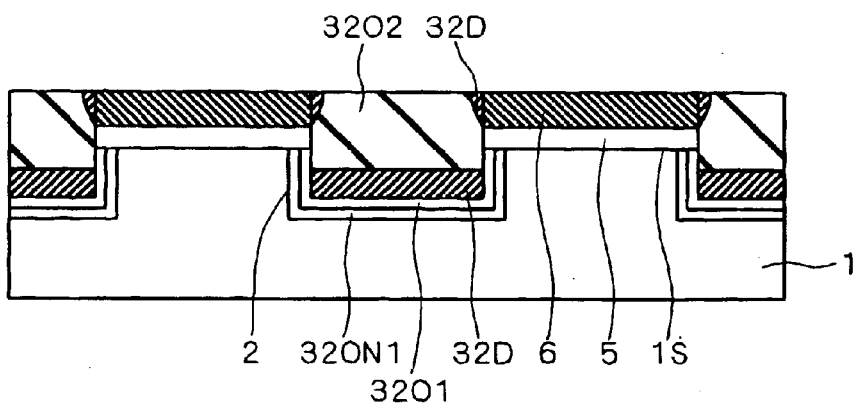
Figure 19:
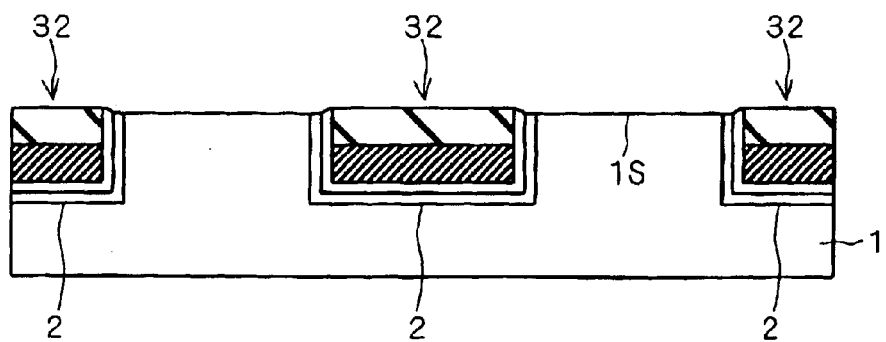

Next, a nitridation process, specifically a thermal process in an atmosphere (gas) containing nitrogen, is performed, whereby the nitrogen is introduced into the vicinities of the interfaces between the silicon oxide film 32O1 and the substrate 1, so as to form the oxynitride film 32ON1 (see FIG. 15). During this nitridation, portions of the oxynitride film 32ON1 are formed to face the side surfaces 2W of the trench 2. In this process, it is thought that the oxynitride film 32ON1 is formed by supply of oxygen from the silicon oxide film 32O1 and supply of silicon from the silicon oxide film 32O1 and/or the substrate 1, and therefore it can be said that the oxynitride film 32ON1 is formed by at least utilizing the silicon oxide film 32O1. The ends of the oxynitride film 32ON1 are in contact with the underlying silicon oxide film 5 and so these ends are at approximately the same level as the substrate's main surface 1S.

Subsequent manufacturing steps are basically the same as those of the semiconductor device 101 described before. Specifically, fluorine-doped silicon oxide film 32D is deposited in the trenches 2 by HDP-CVD (see FIG. 16). Next, silicon oxide film 32O2, part of the oxide portion 32O, is deposited by HDP-CVD, whereby the trenches 2 are filled completely (see FIG. 17). At this time, the silicon oxide film 32O2 is formed in contact with the portions of the silicon oxide film 32O1 that are exposed in the vicinities of the entrances of the openings, so that the spaces near the entrances are filled with the silicon oxide films 32O1, 32O2 and oxynitride film 32ON1. Then, by CMP using the silicon nitride film 6 as a stopper, the portions of the films 32D and 32O2 above the silicon nitride film 6 are removed, whereby the silicon oxide film 32O2 is made flat (see FIG. 18). Subsequently, the silicon oxide film 32O2 is partially removed with hydrofluoric acid to adjust the height of the element isolation structures 32. The silicon nitride film 6 and the underlying silicon oxide film 5 are sequentially removed, to complete the element isolation structures 32 (see FIG. 19). The MOSFETs 90 are then formed and the semiconductor device 102 of FIG. 13 is thus completed.

As shown above, the ends of the oxynitride film 32ON1 are approximately at the same level as the substrate's main surface 1S, and therefore, after the removal of the underlying silicon oxide film 5, the ends of both of the oxynitride film 32ON1 and the silicon oxide film 32O1 are at approximately the same level as the substrate's main surface 1S.

The semiconductor device 102 and its manufacturing method provides the same effects as the semiconductor device 101 described before (see FIGS. 1 and 2).

Now, the semiconductor device 102 can also be manufactured according to the second method of manufacturing the semiconductor device 101 (see FIGS. 9 to 12).

Figure 20:
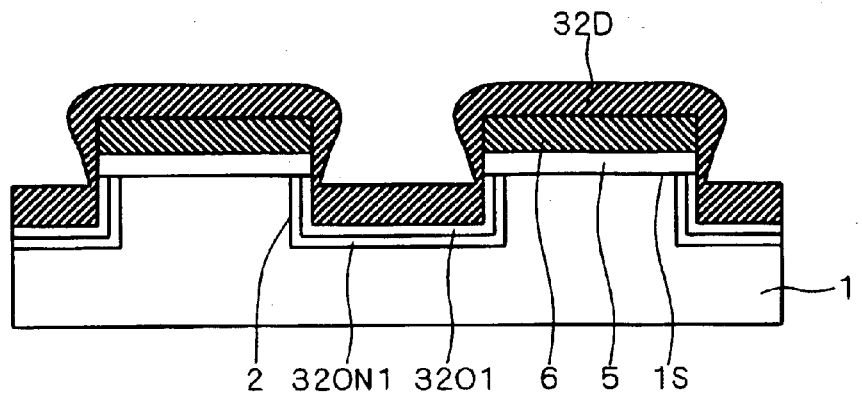
FIGS. 20 to 23 are cross-sectional views used to describe another method for manufacturing the semiconductor device of the second preferred embodiment.
Figure 21:
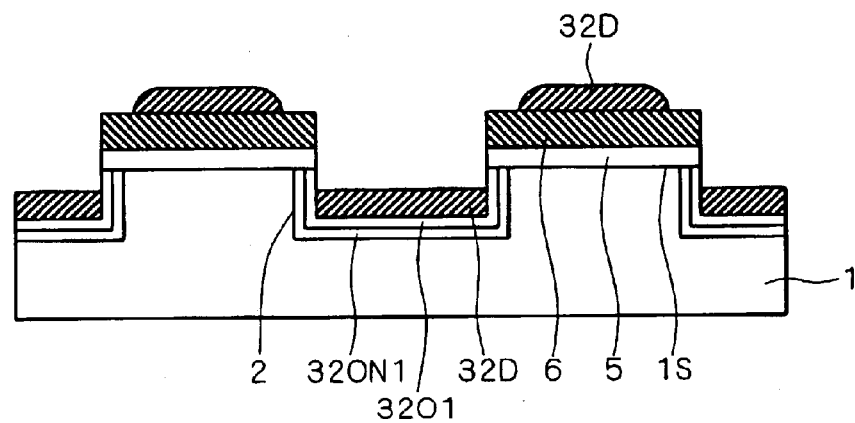

Specifically, the above-described manufacturing process steps are performed to the formation of the oxynitride film 32ON1. Then fluorine-doped silicon oxide film 32D is deposited in the trenches 2 by HDP-CVD (see FIG. 20). At this time, as in the second manufacturing method of the semiconductor device 101, the doped silicon oxide film 32D is deposited in the trenches 2 to a thickness larger than its thickness in the completed element isolation structures 32. Next, the deposited silicon oxide film 32D is partially removed with hydrofluoric acid (see FIG. 21). This HF treatment provides the same effects as that performed in the second manufacturing method of the semiconductor device 101.

Figure 22:
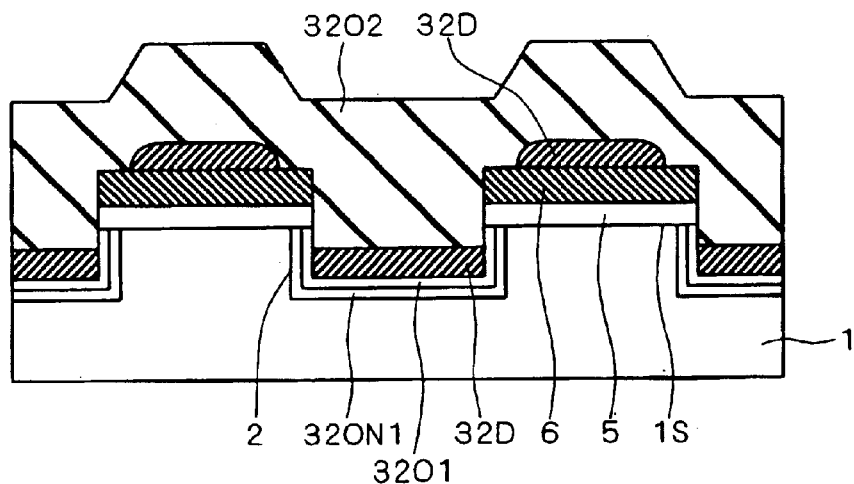
Figure 23:
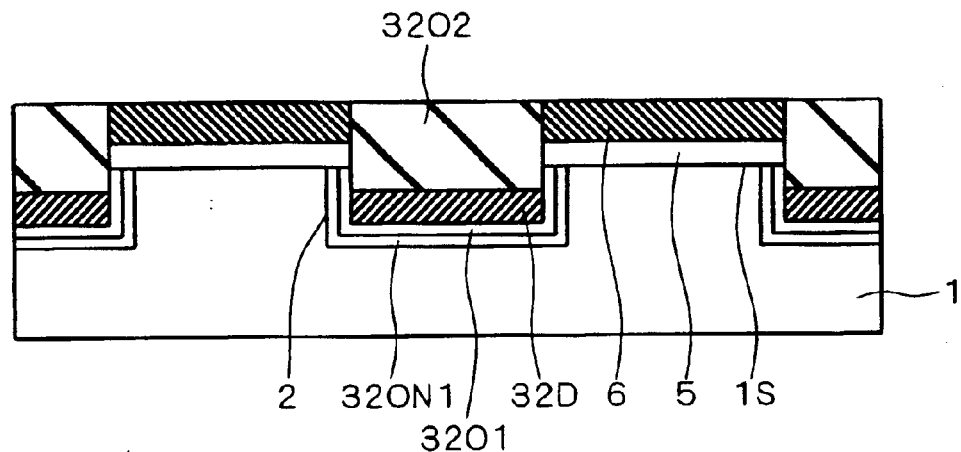

After that, in the same manner shown in the above-described manufacturing method, the silicon oxide film 32O2 is deposited (see FIG. 22) and subsequent process steps, such as CMP (see FIG. 23), are conducted to complete the semiconductor device 102.

Third Preferred Embodiment

Figure 24:
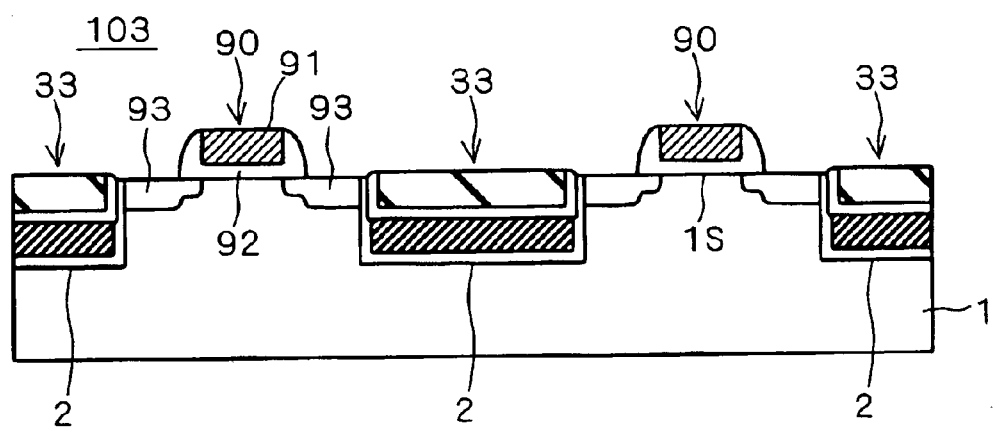
FIG. 24 is a cross-sectional view used to describe a semiconductor device according to a third preferred embodiment.
Figure 25:
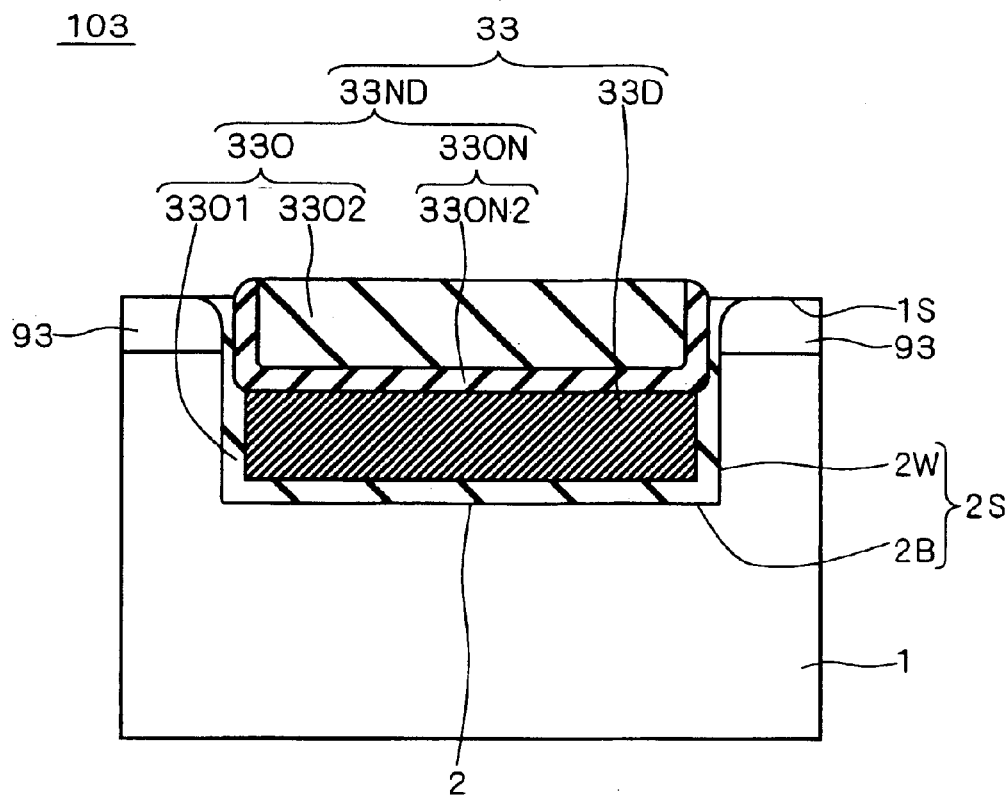
FIG. 25 is a cross-sectional view used to describe the trench-type element isolation in the semiconductor device of the third preferred embodiment.

FIG. 24 is a schematic cross-sectional view of a semiconductor device 103 according to a third preferred embodiment and FIG. 25 is a cross-sectional view used to describe trench-type element isolation structures 33 in the semiconductor device 103. In the semiconductor device 103, the element isolation structures 31 provided in the semiconductor device 101 (see FIGS. 1 and 2) are replaced by element isolation structures 33, where, basically, the bottom portion of the oxynitride film 31ON1 in the element isolation structure 31 (see FIG. 2: the bottom portion means the portion that is positioned opposite to the bottom surface 2B of the trench 2) is placed between the doped silicon oxide film 31D and the silicon oxide film 31O2.

Specifically, element isolation structures 33 are disposed within the trenches 2 in the substrate 1. As shown in FIG. 25, the element isolation structure 33 can be divided roughly into a doped insulator 33D that is doped with impurities (herein, by way of example, a silicon oxide film doped with fluorine) and a peripheral insulator 33ND that is not doped with impurities. The peripheral insulator 33ND is in contact with the doped insulator 33D and entirely surrounds the insulator 33D. The peripheral insulator 33ND can further be divided roughly into an oxide portion 33O formed of silicon oxide and an oxynitride portion 33ON formed of silicon oxynitride; thus the peripheral insulator 33ND does not include any silicon nitride film. In the element isolation structure 33, the oxide portion 33O includes two silicon oxide films 33O1 and 33O2 and the oxynitride portion 33ON includes an oxynitride film 33ON2.

More specifically, the silicon oxide film 33O1 is formed along the inner surface 2S of the trench 2 and is entirely in contact with this inner surface 2S, so that it is U-shaped in cross-section. As for the thickness of the silicon oxide film 33O1, for example, its bottom portion and its side portions near the bottom portion are approximately equal in thickness to the silicon oxide film 31O1 described earlier (see FIG. 2), but its side portions near the entrance of the opening are thinner than the bottom portion.

The doped silicon oxide film 33D is formed in the trench 2 in contact with the silicon oxide film 33O1 and faces the substrate 1 with the silicon oxide film 33O1 interposed between the doped silicon oxide film 33D and the substrate 1. In other words, in the trench 2, the silicon oxide film 33O1 is positioned between the doped silicon oxide film 33D and the substrate 1. It is assumed herein that, like the two films 31D and 31O2 described before (see FIG. 2), the doped silicon oxide film 33D and the silicon oxide film 33O2 described later are approximately equal in thickness.

The oxynitride film 33ON2 is formed in contact with the upper surface of the doped silicon oxide film 33D (the surface of the doped silicon oxide film 33D that is farther away from the bottom surface 2B of the trench 2) and also in contact with the thinner portions of the silicon oxide film 33O1; the oxynitride film 33ON2 is thus U-shaped in cross-section. It can also be said that the U-shaped oxynitride film 33ON2 is formed along the shape of the inner surface 2S of the trench 2. The oxynitride film 33ON2 has portions that face to the side surfaces 2W of the trench 2 with the thinner portions of the silicon oxide film 33O1 interposed therebetween. As will be described later, the oxynitride film 33ON2 is formed by nitridation that utilizes the silicon oxide film 33O1, which is a part of the oxide portion 33O, and the doped silicon oxide film 33D. The oxynitride film 33ON2 has approximately the same thickness as the oxynitride film 31ON1 described before (see FIG. 2).

The silicon oxide film (or an undoped insulator) 33O2, which is a part of the oxide portion 33O, is disposed in contact with the oxynitride film 33ON2 and fills the U-shaped section formed by the film 33ON2. That is to say, in the trench 2, the silicon oxide film 33O2 faces the side surfaces 2W of the trench 2 with the oxynitride film 33ON2 and the silicon oxide film 33O1 interposed between the silicon oxide film 33O2 and the side surfaces 2W and faces the bottom surface 2B of the trench 2 with the oxynitride film 33ON2, the doped silicon oxide film 33D, and the silicon oxide film 33O1 interposed between the silicon oxide film 33O2 and the bottom surface 2B. At this time, the oxynitride film 33ON2 is positioned between the silicon oxide film 33O2 and the substrate 1 and between the silicon oxide film 33O2 and the doped silicon oxide film 33D. The surface of the doped silicon oxide film 33D is entirely in contact with the silicon oxide film 33O1 and the oxynitride film 33ON2. The doped silicon oxide film 33D is isolated from the substrate 1 by the silicon oxide films 33O1, 33O2 and the oxynitride film 33ON2.

In the vicinity of the entrance of the trench 2, the silicon oxide film 33O1, the oxynitride film 33ON2 and the silicon oxide film 33O2 are arranged in this order from the side surfaces 2W of the trench 2 or from the edges of the entrance; the space near the entrance of the trench 2 is thus filled with these films 33O1, 33ON2 and 32O2, i.e. with the oxide portion 33O and the oxynitride portion 33ON. That is, no silicon nitride film is present in the vicinity of the entrance of the opening.

Also, in the vicinity of the entrance of the trench 2, the ends of the silicon oxide film 33O1 are at approximately the same level as the substrate's main surface 1S, and the ends of the oxynitride film 33ON2 protrude above the substrate's main surface 1S or from the trench 2, and the top surface of the silicon oxide film 33O2 is approximately at the same level as the ends of the oxynitride film 33ON2. That is to say, the element isolation structure 33 has no recess that is lower than the substrate's main surface 1S. Also, the entrance edges of the trench 2, or of the substrate 1, are rounded. In correspondence with this rounded shape, the ends of the silicon oxide film 33O1 are shaped like those of the above-described silicon oxide film 31O1 (see FIG. 2).

As in the semiconductor device 101 (see FIG. 1), MOSFETs 90 are formed in the active regions or element formation regions that are sectioned by the element isolation structures 33.

Next, referring to FIGS. 24 and 25 and the cross-sectional views of FIGS. 26 to 31, a method for manufacturing the semiconductor device 103 is now described. Basically, the manufacturing method of the semiconductor device 103 differs from that of the semiconductor device 101 in that the oxynitride film 31ON1 and the doped silicon oxide film 31D are formed in reverse order.

Figure 26:
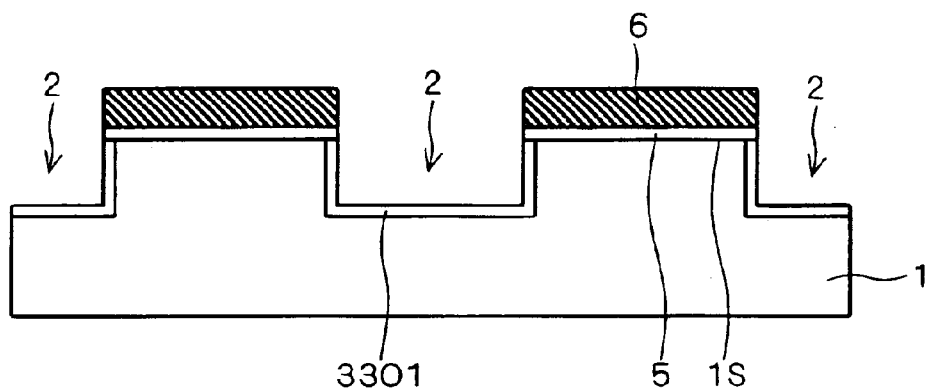
FIGS. 26 to 31 are cross-sectional views used to describe a method for manufacturing the semiconductor device of the third preferred embodiment.
Figure 27:
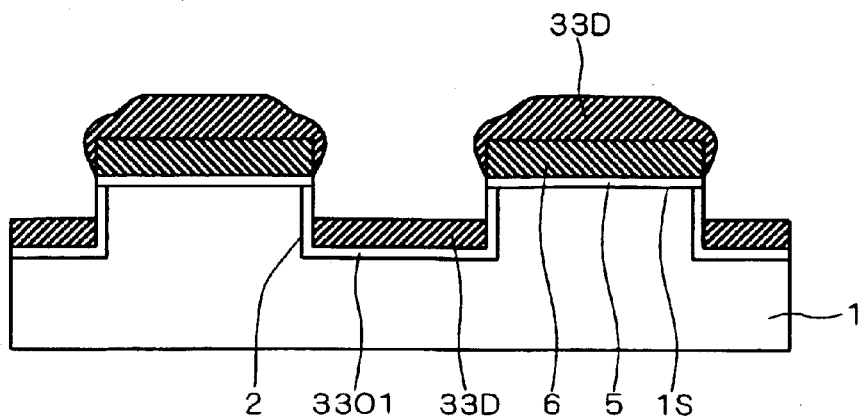

First, as in the manufacturing method of the semiconductor device 101, the underlying silicon oxide film 5 and the silicon nitride film 6 are formed and then trenches 2 are formed into the substrate 1 (see FIG. 26). Subsequently, as in the manufacturing method of the semiconductor device 101, the inner surfaces 2S of the substrate 1, exposed in the trenches 2, are thermally oxidized to form the silicon oxide film 33O1 (see FIG. 26).

After that, fluorine-doped silicon oxide film 33D is deposited in the trenches 2 by HDP-CVD (see FIG. 27) in the manner shown in the manufacturing method of the semiconductor device 101 described before.

Figure 28:
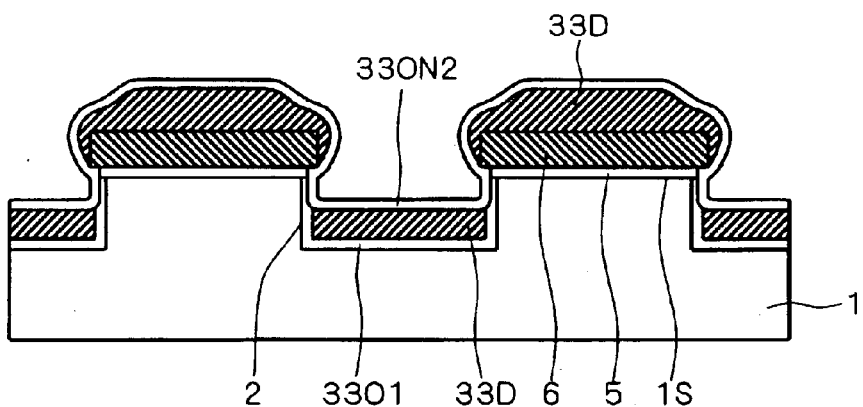
Figure 29:
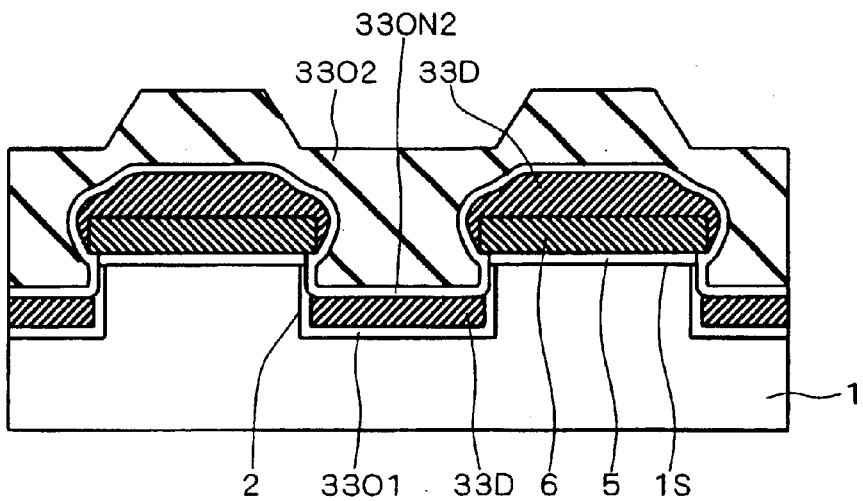
Figure 30:
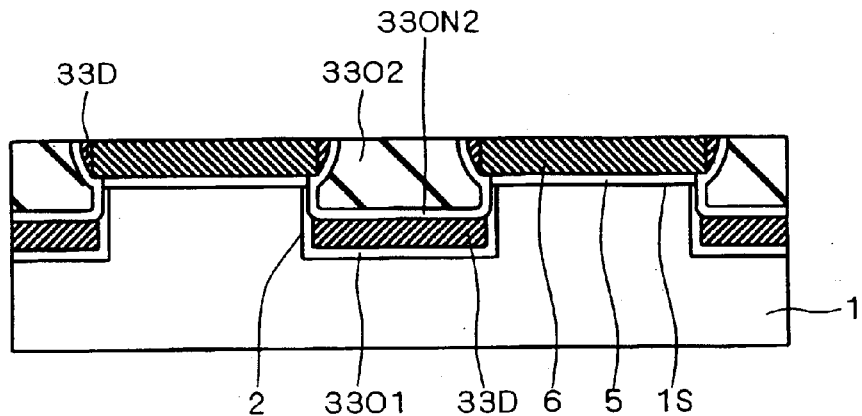
Figure 31:
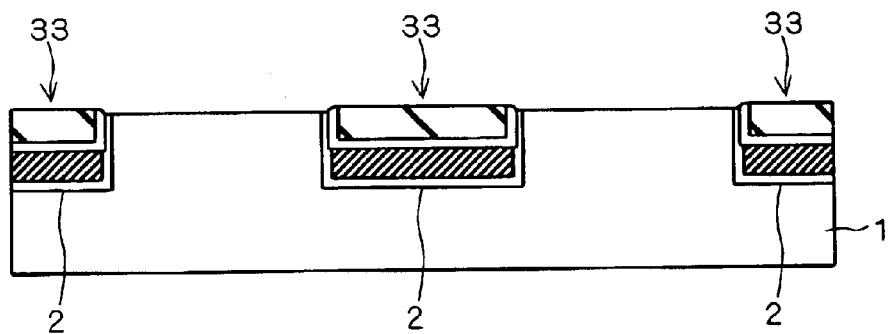

Next, a nitridation process, specifically a plasma process in an atmosphere (gas) containing nitrogen, is performed, whereby the oxynitride film 33ON2 is formed in the exposed surfaces of the silicon oxide film 33O1 and the doped silicon oxide film 33D by utilizing these films 33O1 and 33D (see FIG. 28). With this nitridation process, the oxynitride film 33ON2 is formed in contact with the silicon oxide film 33O1, and portions of the oxynitride film 33ON2 face to the side surfaces 2W of the trench 2. Also, the oxynitride film 33ON2 is placed closer to the entrance of the trench 2 than the doped silicon oxide film 33D. At this time, the oxynitride film 33ON2 is formed also in the exposed surfaces of the underlying silicon oxide film 5. By this nitridation, the portions of the silicon oxide film 33O1 where the oxynitride film 33ON2 is formed are thinned, which correspond to the above-mentioned thinned portions of the silicon oxide film 33O1. The doped silicon oxide film 33D, too, is thinned by the nitridation process, so that the film 33D is deposited considering this amount of reduction.

Subsequent manufacturing steps are basically the same as those for the semiconductor device 101 described before. Specifically, the silicon oxide film 33O2, which is part of the oxide portion 33O, is deposited by HDP-CVD, whereby the trenches 2 are completely filled (see FIG. 29). Then, by CMP using the silicon nitride film 6 as a stopper, the portions of the films 33D, 33ON2, and 33O2 above the silicon nitride film 6 are removed, so as to make the silicon oxide film 33O2 flat (see FIG. 30). Subsequently, the silicon oxide film 33O2 is partially removed with hydrofluoric acid to adjust the height of the element isolation structures 33. The silicon nitride film 6 and the underlying silicon oxide film 5 are then sequentially removed, to complete the element isolation structures 33 (see FIG. 31). According to this manufacturing method, the oxynitride film 33ON2 is situated between the doped silicon oxide film 33D and the silicon oxide film 33O2. Also, the doped silicon oxide film 33D is surrounded by the peripheral insulator 33ND through the formation of the silicon oxide films 33O1, 33O2 and the oxynitride film 33ON2. The MOSFETs 90 are then formed and the semiconductor device 103 of FIG. 24 is thus completed.

Now, oxynitride can be etched by both hydrofluoric acid and thermal phosphoric acid (however, the etch rates are generally lower than those of silicon oxide and silicon nitride). Accordingly, the portions of the oxynitride film 33ON2 that remain after the CMP on the side surfaces of the silicon nitride film 6 are removed (or can be removed) during the etching of the silicon oxide film 33O2, the silicon nitride film 6 and/or the underlying silicon oxide film 5. The silicon oxide film 33O1 is formed in the same way as the silicon oxide film 31O1 described earlier (see FIG. 2). Accordingly, after the removal of the underlying silicon oxide film 5, the ends of the silicon oxide film 33O1 are placed at approximately the same level as the substrate's main surface 1S.

The semiconductor device 103 and its manufacturing method provide the same effects as the semiconductor device 101 described earlier (see FIGS. 1 and 2). The oxynitride film 33ON2 more reliably prevents impurity diffusion into the vicinities of the substrate's main surface 1S and into components on the element isolation structures 33 (e.g. the gate electrodes 91).

The semiconductor device 103 can also be manufactured according to the second method for manufacturing the semiconductor device 101 (see FIGS. 9 to 12).

Figure 32:
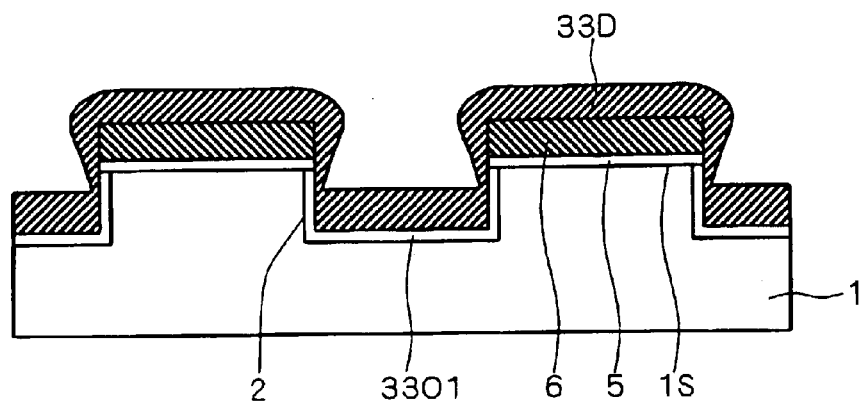
FIGS. 32 to 36 are cross-sectional views used to describe another method for manufacturing the semiconductor device of the third preferred embodiment.
Figure 33:
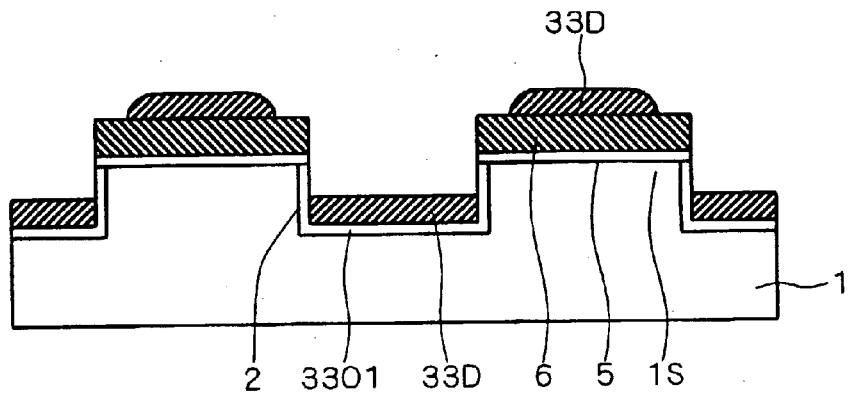

Specifically, the above-described manufacturing process steps are performed to the formation of the silicon oxide film 33O1. Then the fluorine-doped silicon oxide film 33D is deposited in the trenches 2 by HDP-CVD (see FIG. 32). At this time, as in the second manufacturing method of the semiconductor device 101, the doped silicon oxide film 33D is deposited in the trenches 2 to a thickness larger than its thickness in the completed element isolation structures 33. Next, the deposited silicon oxide film 33D is partially removed with hydrofluoric acid (see FIG. 33). At this time, considering the formation of the oxynitride film 33ON2, the silicon oxide film 33D is processed to a thickness larger than its thickness in the completed element isolation structures 33. This HF treatment provides the same effects as that performed in the second manufacturing method of the semiconductor device 101.

Figure 34:
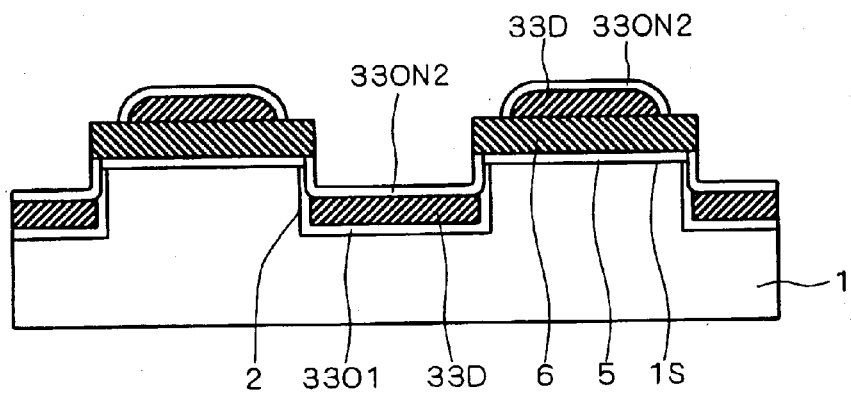
Figure 35:
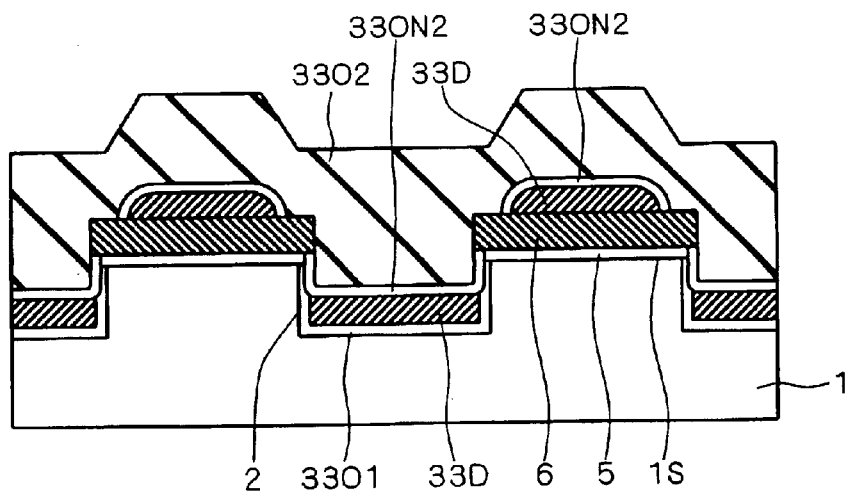
Figure 36:
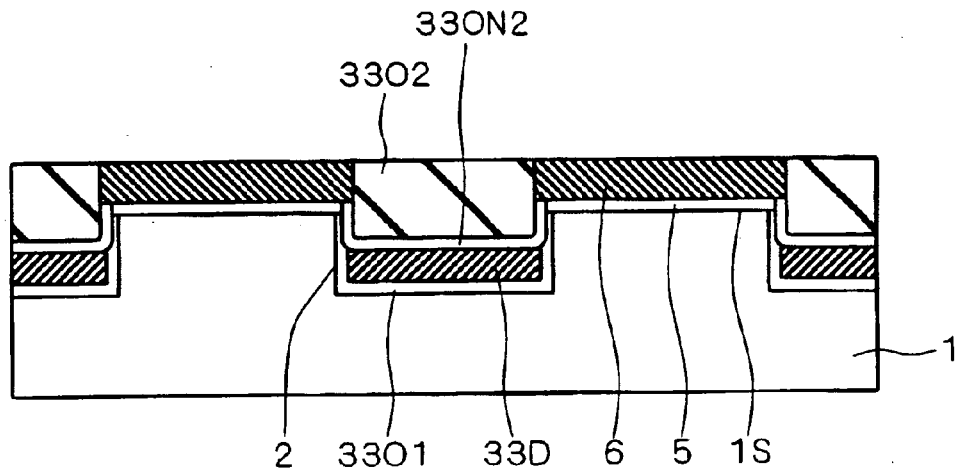

After that, in the manner shown in the above-described manufacturing method, the oxynitride film 33ON2 is formed by nitridation (see FIG. 34), the silicon oxide film 33O2 is deposited (see FIG. 35) and subsequent process steps, such as CMP (see FIG. 36), are conducted to complete the semiconductor device 103.

Fourth Preferred Embodiment

Figure 37:
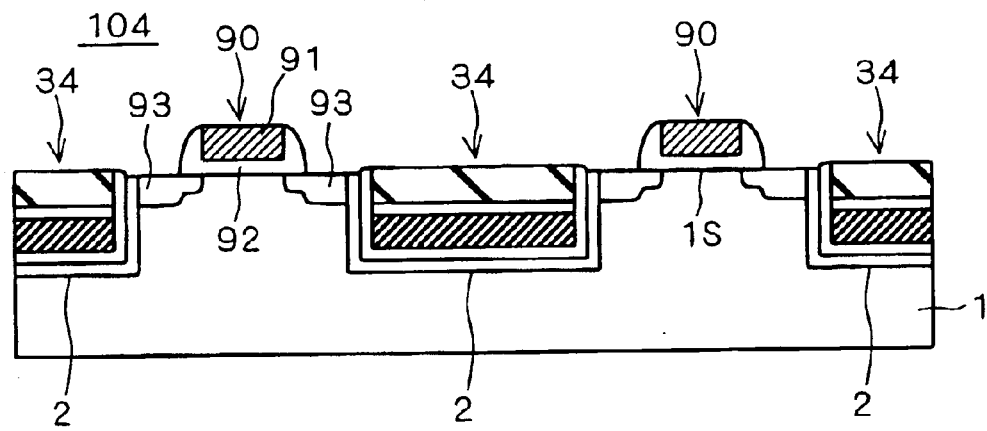
FIG. 37 is a cross-sectional view used to describe a semiconductor device according to a fourth preferred embodiment.
Figure 38:
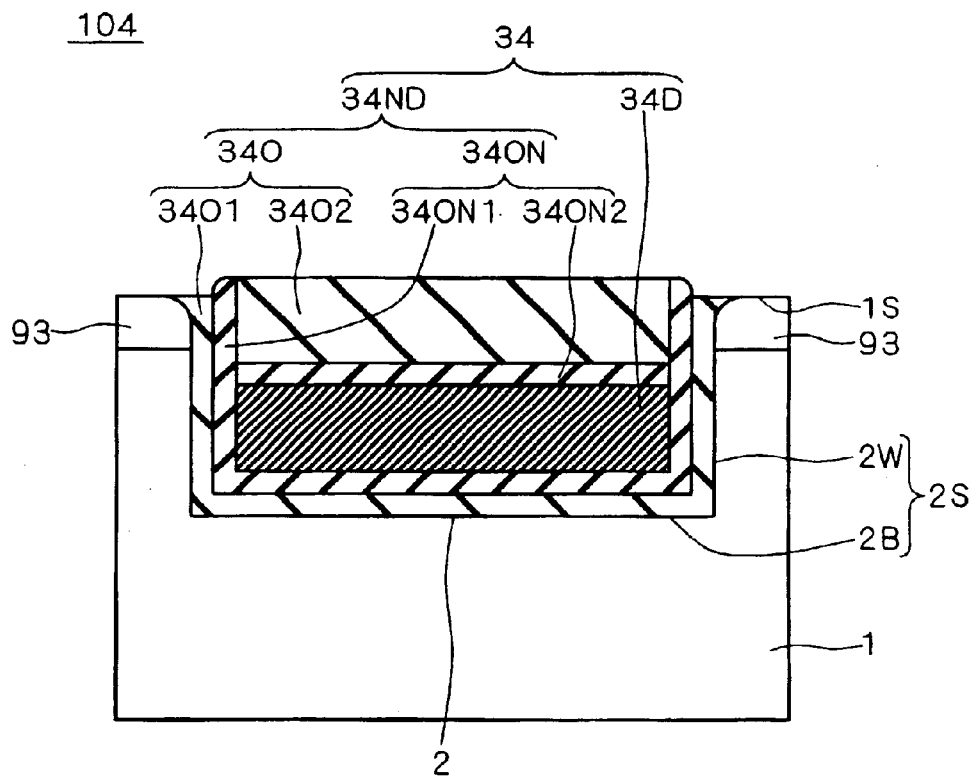
FIG. 38 is a cross-sectional view used to describe the trench-type element isolation in the semiconductor device of the fourth preferred embodiment.

FIG. 37 is a schematic cross-sectional view of a semiconductor device 104 according to a fourth preferred embodiment and FIG. 38 is a cross-sectional view used to describe trench-type element isolation structures 34 in the semiconductor device 104. In the semiconductor device 104, the element isolation structures 31 provided in the semiconductor device 101 (see FIGS. 1 and 2) are replaced by element isolation structures 34, where, basically, another oxynitride film is provided between the doped silicon oxide film 31D and the silicon oxide film 31O2 provided in the element isolation structures 31 (see FIG. 2).

Specifically, the element isolation structures 34 are disposed within the trenches 2 in the substrate 1. As shown in FIG. 38, the element isolation structure 34 can be divided roughly into a doped insulator 34D that is doped with impurities (herein, by way of example, a silicon oxide film doped with fluorine) and a peripheral insulator 34ND that is not doped with impurities. The peripheral insulator 34ND is in contact with the doped insulator 34D and entirely surrounds the insulator 34D. The peripheral insulator 34ND can further be divided roughly into an oxide portion 34O formed of silicon oxide and an oxynitride portion 34ON formed of silicon oxynitride; thus the peripheral insulator 34ND does not include any silicon nitride film. In the element isolation structure 34, the oxide portion 34O includes two silicon oxide films 34O1 and 34O2 and the oxynitride portion 34ON includes two oxynitride films 34ON1 and 34ON2.

More specifically, the silicon oxide film 34O1 is formed along the inner surface 2S of the trench 2 and is entirely in contact with this inner surface 2S, so that it is U-shaped in cross-section. The silicon oxide film 34O1 has about the same thickness as the silicon oxide film 31O1 shown earlier (see FIG. 2).

The oxynitride film 34ON1 is formed in the trench 2 to face the substrate 1 with the silicon oxide film 34O1 interposed between the oxynitride film 34ON1 and the substrate 1. The oxynitride film 34ON1 is formed along the silicon oxide film 34O1 and is in contact with the film 34O1; the oxynitride film 34ON1 is thus also U-shaped in cross-section. The oxynitride film 34ON1 has portions that face the side portions 2W of the trench 2 with the silicon oxide film 34O1 interposed therebetween. As will be described later, the oxynitride film 34ON1 is formed by nitridation utilizing the silicon oxide film 34O1 included in the oxide portion 34O, and this film 34ON1 has approximately the same thickness as the oxynitride film 31ON1 described before (see FIG. 2).

The doped silicon oxide film 34D is formed in the trench 2 to face the substrate 1 with the oxynitride film 34ON1 and the silicon oxide film 34O1 interposed between the doped silicon oxide film 34D and the substrate 1. In other words, in the trench 2, the oxynitride film 34ON1 and the silicon oxide film 34O1 are positioned between the doped silicon oxide film 34D and the substrate 1. It is assumed herein that, like the two films 31D and 31O2 described before (see FIG. 2), the doped silicon oxide film 34D and the silicon oxide film 34O2, described later, are approximately equal in thickness.

The oxynitride film 34ON2 is formed entirely in contact with the upper surface of the doped silicon oxide film 34D and the ends of the oxynitride film 34ON2 are coupled with the oxynitride film 34ON1 (in contact with it). As will be described later, the oxynitride film 34ON2 is formed by nitridation utilizing the doped silicon oxide film 34D. The oxynitride film 34ON2 has approximately the same thickness as the oxynitride film 34ON1 and also as the oxynitride film 33ON2 shown earlier (see FIG. 25).

The silicon oxide film (or undoped insulator) 34O2, which is part of the oxide portion 34O, is disposed in contact with the oxynitride films 34ON1 and 34ON2 and fills the U-shaped section formed by these films 34ON1 and 34ON2. At this time, the silicon oxide film 34O2 faces the doped silicon oxide film 34D with the oxynitride film 34ON2 interposed therebetween; in other words, the oxynitride film 34ON2 is positioned between the doped silicon oxide film 34D and the silicon oxide film 34O2. Also, the silicon oxide film 34O2 faces the side surfaces 2W of the trench 2 with the oxynitride film 34ON1 and the silicon oxide film 34O1 interposed therebetween, and faces the bottom surface 2B of the trench 2 with the oxynitride film 34ON2, the doped silicon oxide film 34D, and the silicon oxide film 34O1 interposed therebetween. Also, in the trench 2, the oxynitride film 34ON1 is positioned between the doped silicon oxide film 34D and the substrate 1 and between the silicon oxide film 34O2 and the substrate 1. The surface of the doped silicon oxide film 34D is entirely in contact with the oxynitride films 34ON1 and 34ON2, and the doped silicon oxide film 34D is isolated from the substrate 1 by the silicon oxide films 34O1 and 34O2 and the oxynitride films 34ON1 and 34ON2.

In the vicinity of the entrance of the trench 2, the silicon oxide film 34O1, the oxynitride film 34ON1, and the silicon oxide film 34O2 are arranged in this order from the side surfaces 2W of the trench 2 or from the edges of the entrance; the space near the entrance of the trench 2 is thus filled with these films 34O1, 34ON1, 34O2, i.e. with the oxide portion 34O and the oxynitride portion 34ON. That is, no silicon nitride film is present in the vicinity of the entrance of the opening.

Further, in the vicinity of the entrance of the trench 2, the ends of the silicon oxide film 34O1 are at approximately the same level as the substrate's main surface 1S, and the ends of the oxynitride film 34ON1 protrude above the substrate's main surface 1S or from the trench 2, and the top surface of the silicon oxide film 34O2 is at approximately the same level as the ends of the oxynitride film 34ON1. That is to say, the element isolation structure 34 has no recess that is lower than the substrate's main surface 1S. Also, the entrance edges of the trench 2, or of the substrate 1, are rounded. In correspondence with the rounded shape, the ends of the silicon oxide film 34O1 are shaped like those of the silicon oxide film 31O1 described before (see FIG. 2).

As in the semiconductor device 101 (see FIG. 1), MOSFETs 90 are formed in the active regions or element formation regions that are sectioned by the element isolation structures 34.

Next, referring to FIGS. 37 and 38 and the cross-sectional views of FIGS. 39 to 42, a method for manufacturing the semiconductor device 104 is now described. The manufacturing method of the semiconductor device 104 is basically a combination of the manufacturing methods of the semiconductor devices 101 and 103.

Figure 39:
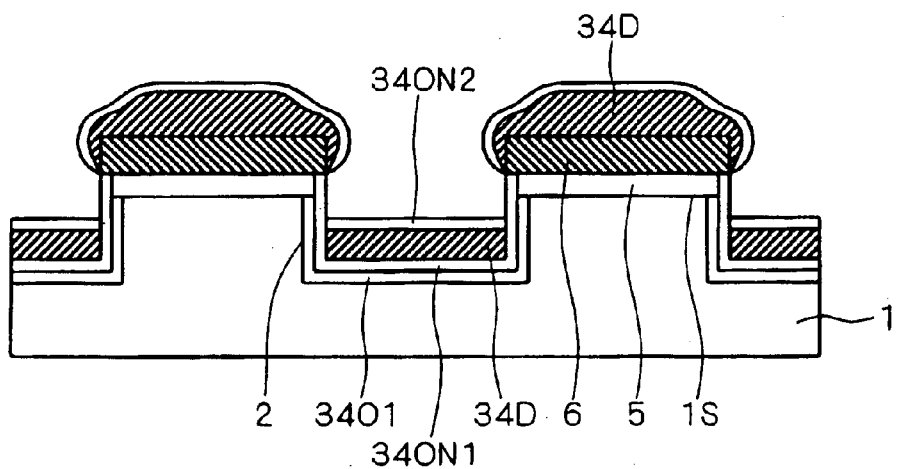
FIGS. 39 to 42 are cross-sectional views used to describe a method for manufacturing the semiconductor device of the fourth preferred embodiment.
Figure 40:
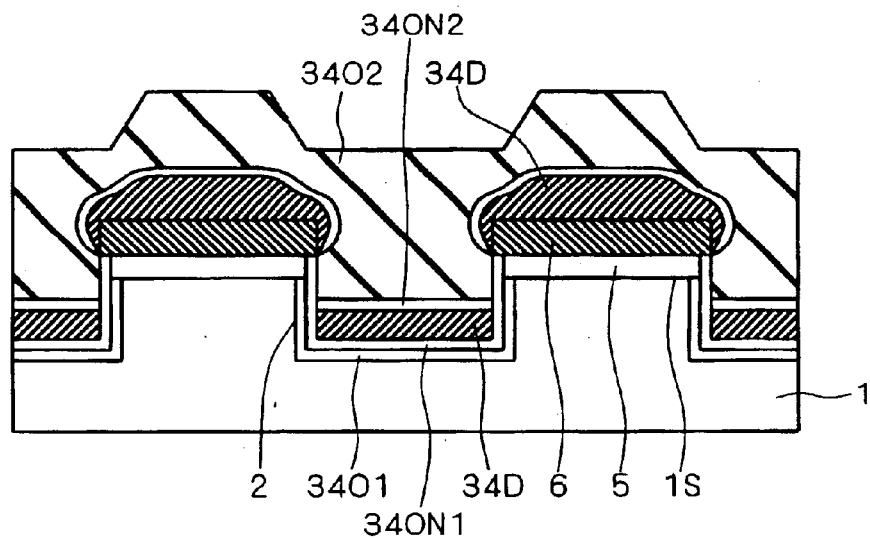
Figure 41:
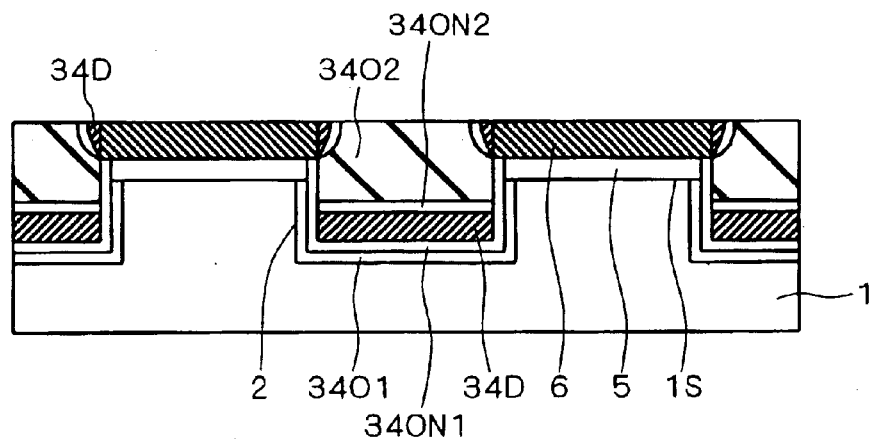
Figure 42:
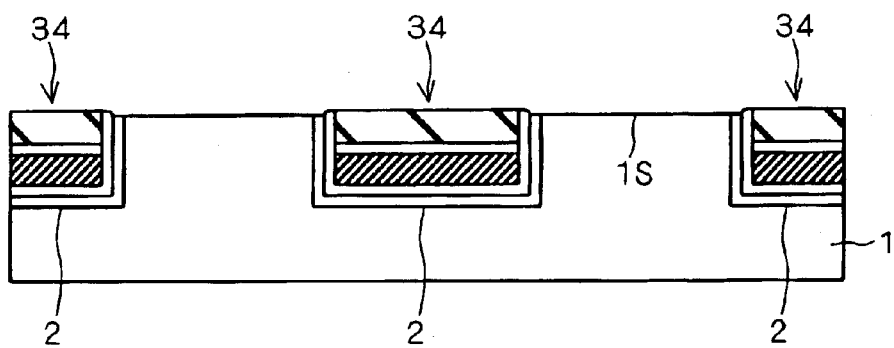

First, as in the manufacturing method of the semiconductor device 101, the underlying silicon oxide film 5, silicon nitride film 6, trenches 2, silicon oxide film 34O1, oxynitride film 34ON1, and doped silicon oxide film 34D are formed (see FIG. 39). Specifically, the underlying silicon oxide film 5 and the silicon nitride film 6 are formed and then the trenches 2 are formed into the substrate 1. Subsequently, the inner surfaces 2S of the substrate 1, exposed within the trenches 2, are thermally oxidized to form the silicon oxide film 34O1. Then a plasma process is performed in an atmosphere containing nitrogen, and thus the oxynitride film 34ON1 is formed in the surface of the silicon oxide film 34O1 by utilizing the film 34O1. After that, the doped silicon oxide film 34D is formed by HDP-CVD.

Next, as in the manufacturing method of the semiconductor device 103, a plasma process is performed in an atmosphere (gas) containing nitrogen, and thus the oxynitride film 34ON2 is formed in the exposed surfaces of the doped silicon oxide film 34D by utilizing this film 34D (see FIG. 39). During this nitridation, exposed portions of the already formed oxynitride film 34ON1 may further grow.

Subsequent manufacturing steps are basically the same as those for the semiconductor devices 103 and 101 described before. Specifically, the silicon oxide film 34O2, which is part of the oxide portion 34O, is deposited by HDP-CVD, whereby the trenches 2 are filled completely (see FIG. 40). Then, by CMP using the silicon nitride film 6 as a stopper, the portions of the films 34D, 34ON2, and 34O2 located above the silicon nitride film 6 are removed, whereby the silicon oxide film 34O2 is made flat (see FIG. 41). Subsequently, the silicon oxide film 34O2 is partially removed with hydrofluoric acid to adjust the height of the element isolation structures 34. The silicon nitride film 6 and the underlying silicon oxide film 5 are sequentially removed, to complete the element isolation structures 34 (see FIG. 42). In this way, the doped silicon oxide film 34D is surrounded by the peripheral insulator 34ND through the formation of the silicon oxide films 34O1, 34O2 and the oxynitride films 34ON1, 34ON2. The MOSFETs 90 are then formed, and thus the semiconductor device 104 of FIG. 37 is completed.

The semiconductor device 104 and its manufacturing method provide the same effects as the semiconductor device 101 (see FIGS. 1 and 2). The oxynitride film 34ON1 more reliably prevents impurity diffusion into the substrate 1 (including the areas near the substrate's main surface 1S) and the oxynitride film 34ON2 more reliably prevents impurity diffusion into the vicinities of the substrate's main surface 1S and into components on the element isolation structures 34 (e.g. gate electrodes 91).

Now, the semiconductor device 104 can also be manufactured according to the second method for manufacturing the semiconductor device 101 (see FIGS. 9 to 12).

Figure 43:
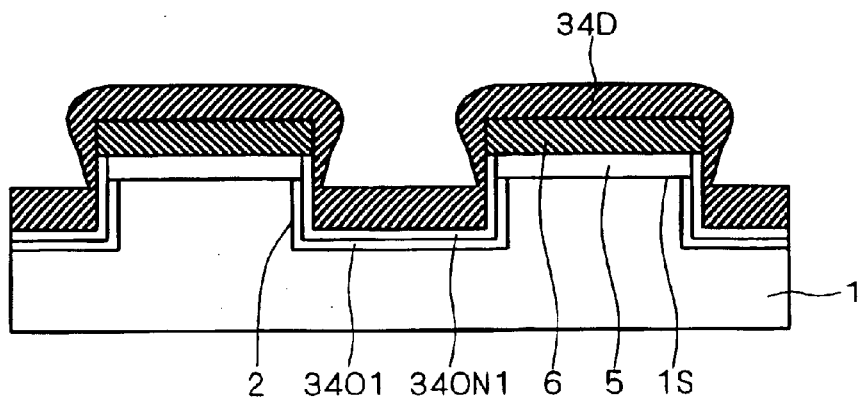
FIGS. 43 to 47 are cross-sectional views used to describe another method for manufacturing the semiconductor device of the fourth preferred embodiment.
Figure 44:
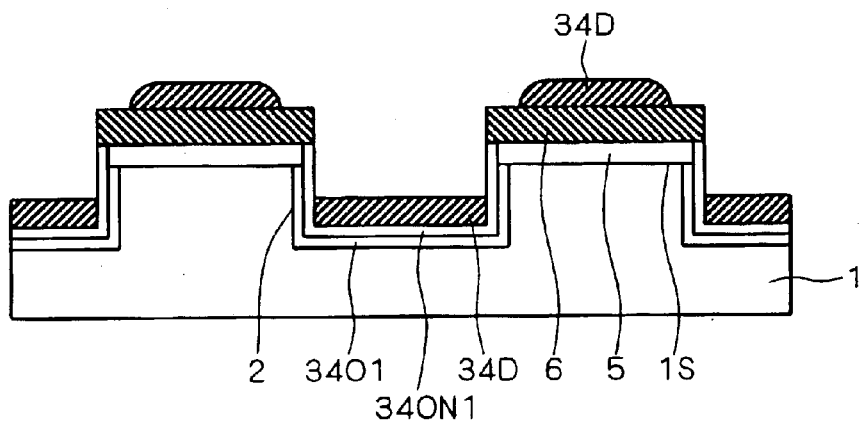

Specifically, the above-described manufacturing process steps are performed to the formation of the oxynitride film 34ON1. Then the fluorine-doped silicon oxide film 34D is deposited in the trenches 2 by HDP-CVD (see FIG. 43). At this time, as in the second manufacturing method of the semiconductor device 101, the doped silicon oxide film 34D is deposited in the trenches 2 to a thickness larger than its thickness in the completed element isolation structures 34. Next, the deposited silicon oxide film 34D is partially removed with hydrofluoric acid (see FIG. 44). At this time, considering the formation of the oxynitride film 34ON2, the silicon oxide film 34D is processed to a thickness somewhat larger than its thickness in the completed element isolation structures 34. This HF treatment provides the same effects as that performed in the second manufacturing method of the semiconductor device 101. At this time, the oxynitride film 34ON1 protects the silicon oxide film 34O1 from hydrofluoric acid.

Figure 45:
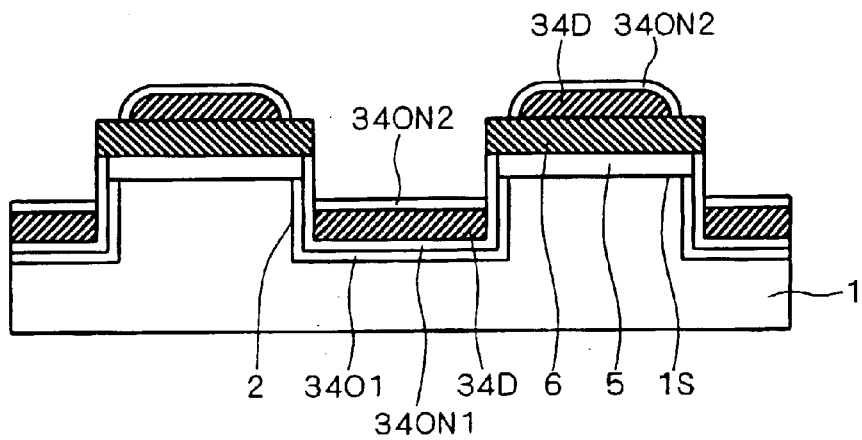
Figure 46:
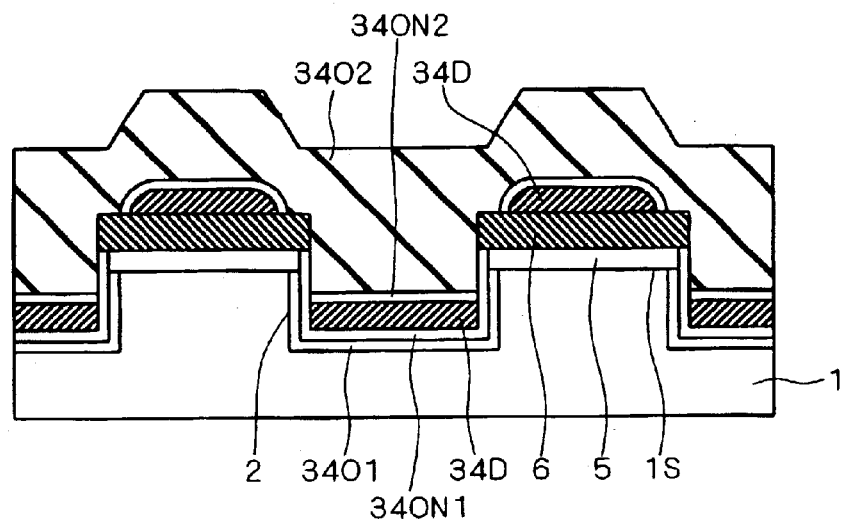
Figure 47:
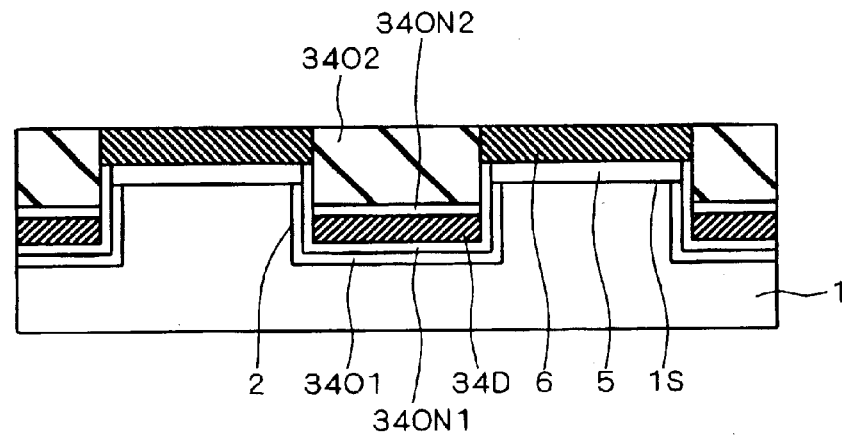

After that, in the manner shown in the above-described manufacturing method, the oxynitride film 34ON2 is formed by nitridation (see FIG. 45), the silicon oxide film 34O2 is deposited (see FIG. 46), and subsequent process steps, such as CMP (see FIG. 47), are conducted to complete the semiconductor device 104.

Fifth Preferred Embodiment

Figure 48:
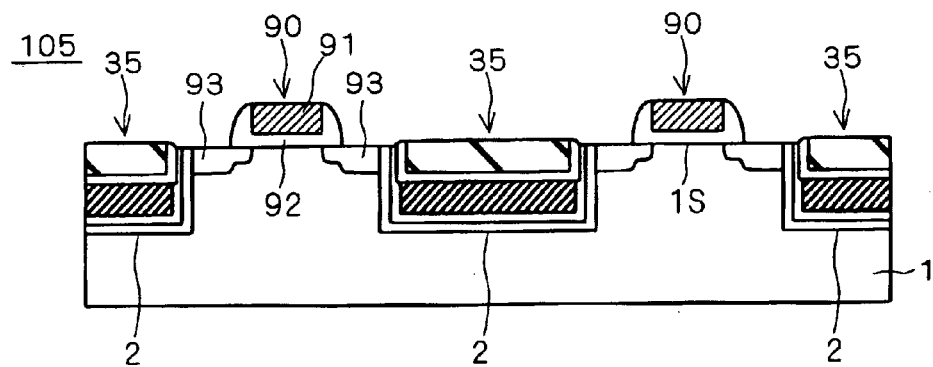
FIG. 48 is a cross-sectional view used to describe a semiconductor device according to a fifth preferred embodiment.
Figure 49:
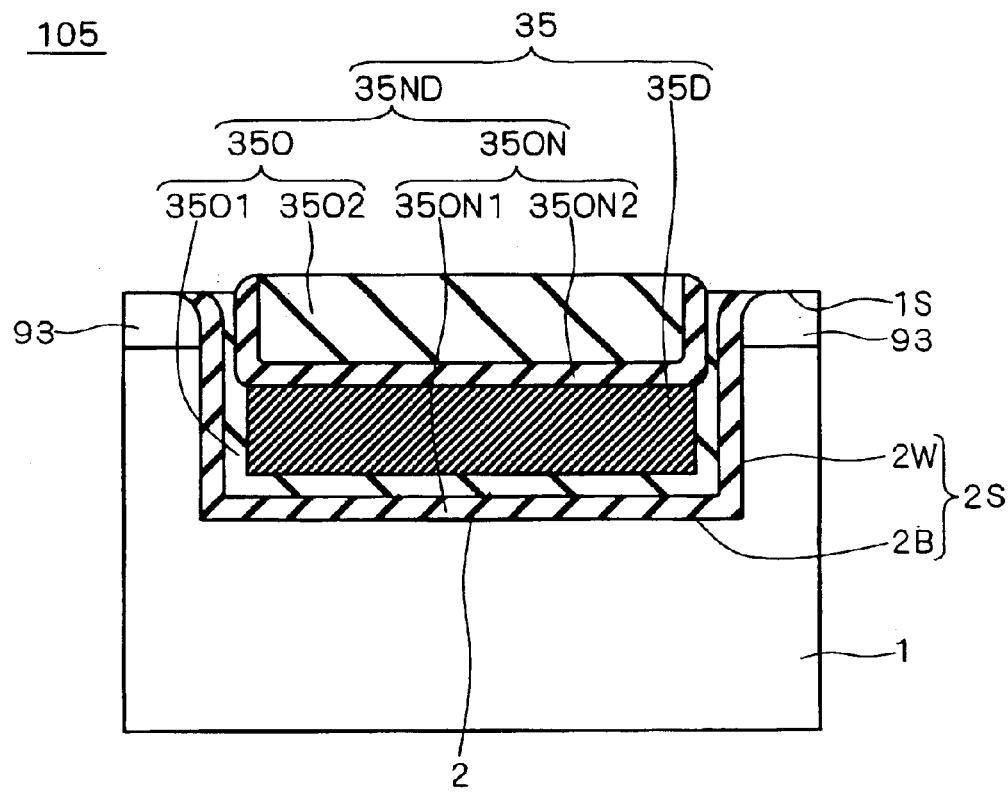
FIG. 49 is a cross-sectional view used to describe the trench-type element isolation in the semiconductor device of the fifth preferred embodiment.

FIG. 48 is a schematic cross-sectional view of a semiconductor device 105 according to a fifth preferred embodiment and FIG. 49 is a cross-sectional view used to describe trench-type element isolation structures 35 in the semiconductor device 105. In the semiconductor device 105, the element isolation structures 31 provided in the semiconductor device 101 (see FIGS. 1 and 2) are replaced by element isolation structures 35, which are basically constructed by combining the structures of the element isolation structures 32 and 33 (see FIGS. 14 and 25).

Specifically, the element isolation structures 35 are disposed within the trenches 2 in the substrate 1. As shown in FIG. 49, the element isolation structure 35 can be divided roughly into a doped insulator 35D that is doped with impurities (herein, by way of example, a silicon oxide film doped with fluorine) and a peripheral insulator 35ND that is not doped with impurities. The peripheral insulator 35ND is in contact with the doped insulator 35D and entirely surrounds the insulator 35D. The peripheral insulator 35ND can further be divided roughly into an oxide portion 35O formed of silicon oxide and an oxynitride portion 35ON formed of silicon oxynitride; thus the peripheral insulator 35ND does not include any silicon nitride film. In the element isolation structure 35, the oxide portion 35O includes two silicon oxide films 35O1 and 35O2 and the oxynitride portion 35ON includes two oxynitride films 35ON1 and 35ON2.

More specifically, the oxynitride film 35ON1 is formed along the inner surface 2S of the trench 2 and is entirely in contact with the inner surface 2S, so that it is U-shaped in cross-section. The oxynitride film 35ON1 has portions that face the side surfaces 2W of the trench 2. As will be described later, the oxynitride film 35ON1 is formed by nitridation utilizing the silicon oxide film 35O1 included in the oxide portion 35O. The oxynitride film 35ON1 has about the same thickness as the oxynitride film 31ON1 described earlier (see FIG. 2).

The silicon oxide film 35O1 is disposed in the trench 2 to face the substrate 1 with the oxynitride film 35ON1 interposed between the silicon oxide film 35O1 and the substrate 1. The silicon oxide film 35O1 is formed along the oxynitride film 35ON1 and is in contact with this film 35ON1; the silicon oxide film 35O1 is thus also U-shaped in cross-section. As for the thickness of the silicon oxide film 35O1, for example, its bottom portion and its side portions near the bottom portion are approximately equal in thickness to the silicon oxide film 31O1 (see FIG. 2), but its side portions near the entrance of the opening are thinner than its bottom portion.

The doped silicon oxide film 35D is disposed in the trench 2 in contact with the silicon oxide film 35O1 and faces the substrate 1 with the silicon oxide film 35O1 and the oxynitride film 35ON1 interposed between the doped silicon oxide film 35D and the substrate 1. In other words, in the trench 2, the silicon oxide film 35O1 and the oxynitride film 35ON1 are positioned between the doped silicon oxide film 35D and the substrate 1. It is assumed herein that, like the two films 31D and 31O2 described before (see FIG. 2), the doped silicon oxide film 35D and the silicon oxide film 35O2, which will be described later, have approximately the same thickness.

The oxynitride film 35ON2 is formed in contact with the upper surface of the doped silicon oxide film 35D and the thinner portions of the silicon oxide film 35O1; the oxynitride film 35ON2 is thus U-shaped in cross-section. It can also be said that the U-shaped oxynitride film 35ON2 is formed along the shape of the inner surface 2S of the trench 2. At this time, the oxynitride film 35ON2 has portions that face to the side surfaces 2W of the trench 2 with the thinner portions of the silicon oxide film 35O1 interposed therebetween. As will be described later, the oxynitride film 35ON2 is formed by nitridation utilizing the silicon oxide film 35O1, which is a part of the oxide portion 35O, and the doped silicon oxide film 35D. The oxynitride film 35ON2 has approximately the same thickness as the oxynitride films 31ON1 and 33ON2 described before (see FIGS. 2 and 25) and also as the oxynitride.

The silicon oxide film (or undoped insulator) 35O2, which is a part of the oxide portion 35O, is disposed in contact with the oxynitride film 35ON2 and fills the U-shaped section formed by the film 35ON2. That is to say, in the trench 2, the silicon oxide film 35O2 faces the side surfaces 2W of the trench 2 with the oxynitride films 35ON1 and 35ON2 and the silicon oxide film 35O1 interposed therebetween and faces the bottom surface 2B of the trench 2 with the oxynitride films 35ON1, 35ON2, the doped silicon oxide film 35D, and the silicon oxide film 35O1 interposed therebetween. At this time, the oxynitride film 35ON2 is positioned between the silicon oxide film 35O2 and the substrate 1 and between the silicon oxide film 35O2 and the doped silicon oxide film 35D. The surface of the doped silicon oxide film 35D is entirely in contact with the silicon oxide film 35O1 and the oxynitride film 35ON2. The doped silicon oxide film 35D is isolated from the substrate 1 by the silicon oxide films 35O1, 35O2 and the oxynitride films 35ON1, 35ON2. The oxynitride film 35ON1 in the trench 2 is positioned between the doped silicon oxide film 35D and the substrate 1 and between the silicon oxide film 35O2 and the substrate 1.

In the vicinity of the entrance of the trench 2, the oxynitride film 35ON1, the silicon oxide film 35O1, the oxynitride film 35ON2, and the silicon oxide film 35O2 are arranged in this order from the side surfaces 2W of the trench 2 or from the edges of the entrance; the space near the entrance of the trench 2 is thus filled with these films 35ON1, 35O1, 35ON2, and 35O2, i.e. with the oxide portion 35O and the oxynitride portion 35ON. That is, no silicon nitride film is present in the vicinity of the entrance of the opening.

Also, in the vicinity of the entrance of the trench 2, the ends of the oxynitride film 35ON1 and the silicon oxide film 35O1 are at approximately the same level as the substrate's main surface 1S, and the ends of the oxynitride film 35ON2 protrude above the substrate's main surface 1S or from the trench 2, and the top surface of the silicon oxide film 35O2 is approximately at the same level as the ends of the oxynitride film 35ON2. That is to say, the element isolation structure 35 has no recess that is lower than the substrate's main surface 1S. Also, the entrance edges of the trench 2, or of the substrate 1, are rounded. In correspondence with this rounded shape, the ends of the oxynitride film 35ON1 and the silicon oxide film 35O1 are shaped like those of the above-described oxynitride film 32ON1 and silicon oxide film 32O1 (see FIG. 14).

As in the semiconductor device 101 (see FIG. 1), MOSFETs 90 are formed in the active regions or element formation regions that are sectioned by the element isolation structures 35.

Next, referring to FIGS. 48 and 49 and the sectional views of FIGS. 50 to 53, a method for manufacturing the semiconductor device 105 is described. The manufacturing method of the semiconductor device 105 is basically a combination of the manufacturing methods of the semiconductor devices 102 and 103 that are based on the manufacturing method of the semiconductor device 101.

Figure 50:
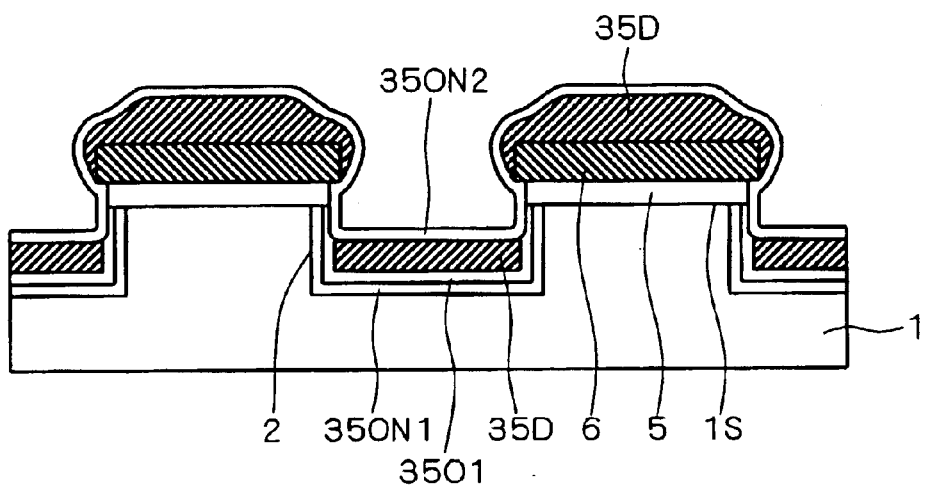
FIGS. 50 to 53 are cross-sectional views used to describe a method for manufacturing the semiconductor device of the fifth preferred embodiment.
Figure 51:
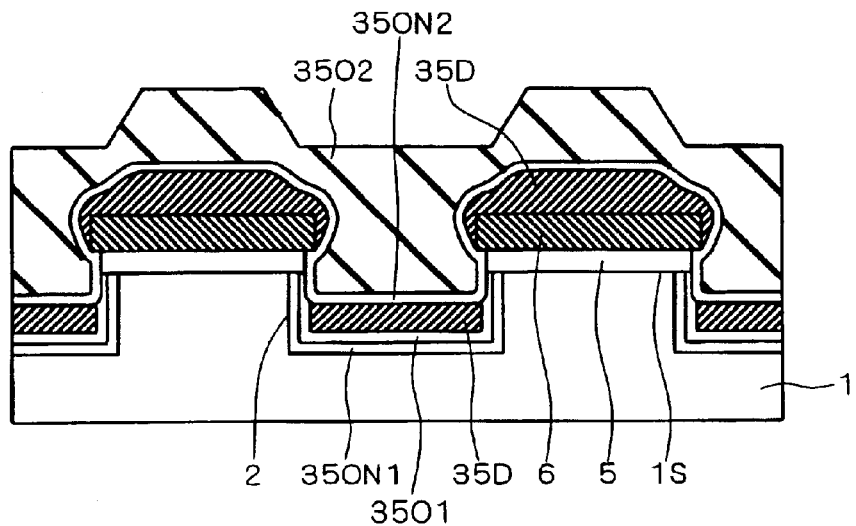
Figure 52:
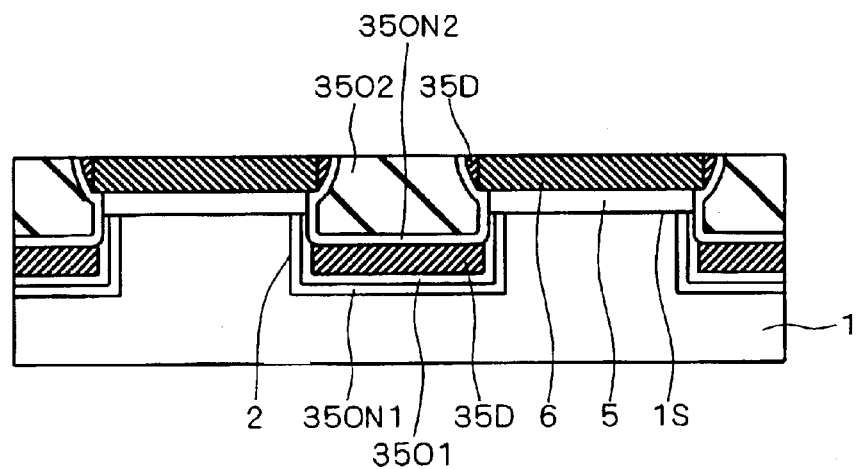
Figure 53:
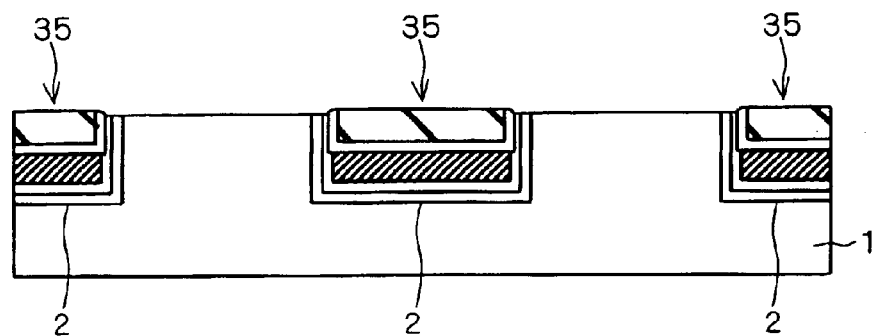

First, as in the manufacturing method of the semiconductor device 102, the underlying silicon oxide film 5, silicon nitride film 6, trenches 2, silicon oxide film 35O1, oxynitride film 35ON1, and doped silicon oxide film 35D are formed (see FIG. 50). Specifically, the underlying silicon oxide film 5 and the silicon nitride film 6 are formed and then the trenches 2 are formed into the substrate 1. Subsequently, the inner surfaces 2S of the substrate 1, exposed in the trenches 2, are thermally oxidized to form the silicon oxide film 35O1. Then a thermal process is performed in an atmosphere containing nitrogen, whereby the oxynitride film 35ON1 is formed at the interface between the silicon oxide film 35O1 and the substrate 1, by utilizing the film 35O1. After that, the doped silicon oxide film 35D is formed by HDP-CVD.

Subsequent manufacturing process steps are basically the same as those for the semiconductor device 103. Specifically, a plasma process is performed in an atmosphere (gas) containing nitrogen, whereby the oxynitride film 35ON2 is formed in the exposed surfaces of the doped silicon oxide film 35D, the silicon oxide film 35O1, and the underlying silicon oxide film 5 (see FIG. 50). Next, the silicon oxide film 35O2, which is part of the oxide portion 35O, is deposited by HDP-CVD, whereby the trenches 2 are filled completely (see FIG. 51). Then, by CMP using the silicon nitride film 6 as a stopper, the portions of the films 35D, 35ON2, and 35O2 located above the silicon nitride film 6 are removed, whereby the silicon oxide film 35O2 is made flat (see FIG. 52). Subsequently, the silicon oxide film 35O2 is partially removed with hydrofluoric acid to adjust the height of the element isolation structures 35. The silicon nitride film 6 and the underlying silicon oxide film 5 are then sequentially removed, to complete the element isolation structures 35 (see FIG. 53). In this way, the doped silicon oxide film 35D is surrounded by the peripheral insulator 35ND through the formation of the silicon oxide films 35O1, 35O2 and the oxynitride films 35ON1, 35ON2. The MOSFETs 90 are then formed, and thus the semiconductor device 105 of FIG. 48 is completed.

The semiconductor device 105 and its manufacturing method provide the same effects as the semiconductor device 101 (see FIGS. 1 and 2). The oxynitride film 35ON1 more reliably prevents impurity diffusion into the substrate 1 (including areas near the substrate's main surface 1S) and the oxynitride film 35ON2 more reliably prevents impurity diffusion into the vicinities of the substrate's main surface 1S and into components on the element isolation structures 35 (e.g. gate electrodes 91).

Now, the semiconductor device 105 can also be manufactured according to the second method for manufacturing the semiconductor device 101 (see FIGS. 9 to 12).

Figure 54:
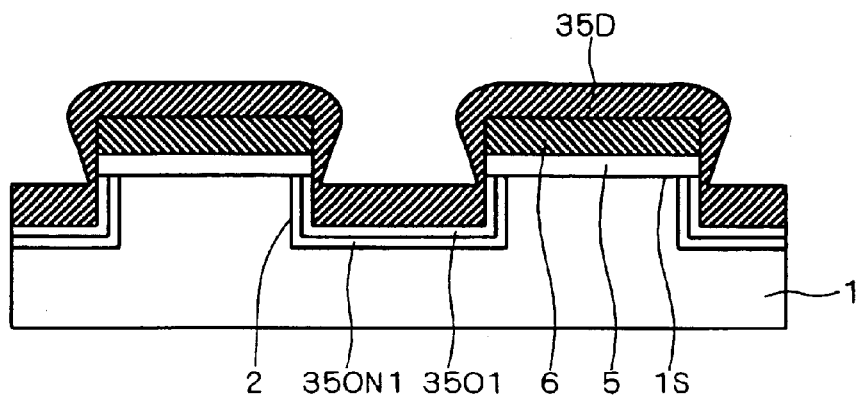
FIGS. 54 to 58 are cross-sectional views used to describe another method for manufacturing the semiconductor device of the fifth preferred embodiment.
Figure 55:
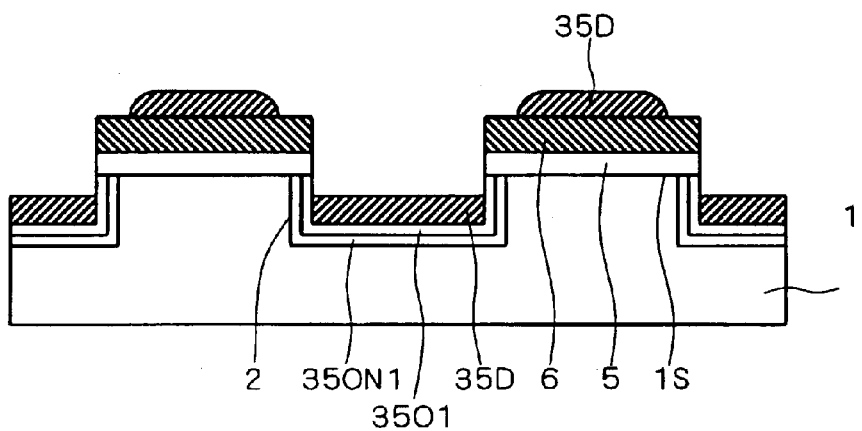

Specifically, the above-described manufacturing process steps are performed to the formation of the oxynitride film 35ON1. Then the fluorine-doped silicon oxide film 35D is deposited in the trenches 2 by HDP-CVD (see FIG. 54). At this time, as in the second manufacturing method of the semiconductor device 101, the doped silicon oxide film 35D is deposited in the trenches 2 to a thickness larger than its thickness in the completed element isolation structures 35. Next, the deposited silicon oxide film 35D is partially removed with hydrofluoric acid (see FIG. 55). At this time, considering the formation of the oxynitride film 35ON2, the silicon oxide film 35D is processed to a thickness larger than its thickness in the completed element isolation structures 35. This HF treatment provides the same effects as that performed in the second manufacturing method of the semiconductor device 101.

Figure 56:
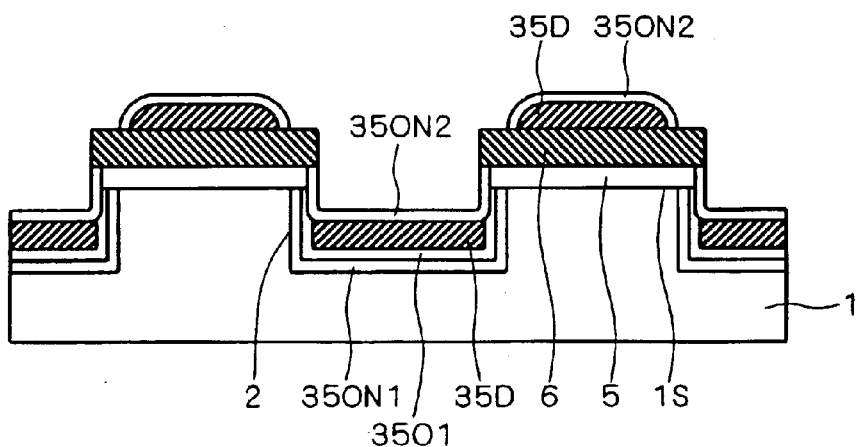
Figure 57:
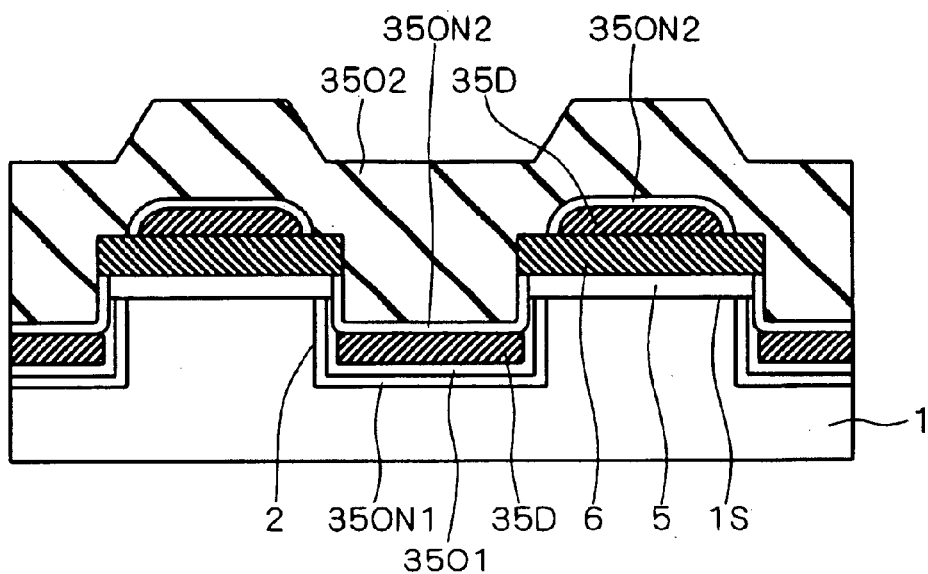
Figure 58:
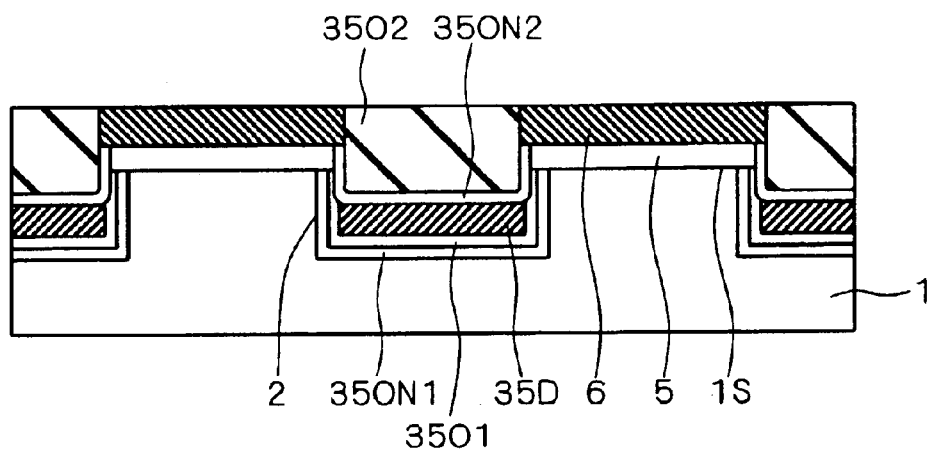

After that, in the manner shown in the above-described manufacturing method, the oxynitride film 35ON2 is formed by nitridation (see FIG. 56), the silicon oxide film 35O2 is deposited (see FIG. 57), and subsequent process steps, such as CMP (see FIG. 58), are conducted to complete the semiconductor device 105.

First Modification of the First to Fifth Preferred Embodiments

The above-described semiconductor devices 101 to 105 can be manufactured by using a manufacturing method disclosed in U.S. Pat. No. 6,265,743 (which corresponds to Japanese Patent Application Laid-Open No. 10-340950 (1998)). The manufacturing method is now described referring to the cross-sectional views of FIGS. 59 to 62, where the semiconductor device 101 is shown by way of example.

Figure 59:
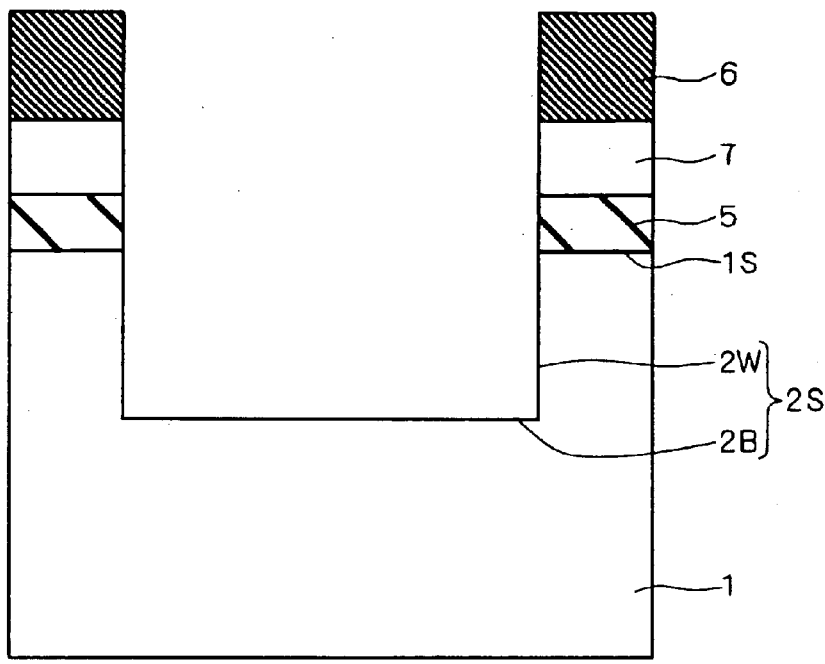
FIGS. 59 to 62 are cross-sectional views used to describe a semiconductor device manufacturing method according to a first modification of the first to fifth preferred embodiments.

First, the underlying silicon oxide film 5, a non-single crystal silicon film 7 (about 100 to 300 nm in thickness), and the silicon nitride film 6 are sequentially formed on the substrate's main surface 1S (see FIG. 59). The non-single crystal silicon film 7 can be a polycrystalline or an amorphous film. Then, as has been described in the manufacturing method shown earlier, the films 5, 7, 6 and the substrate 1 are pattern-etched by photolithography, so as to form trenches 2 into the substrate 1 (see FIG. 59).

Subsequently, the exposed surface of the trench 2 is thermally oxidized to form the silicon oxide film 31O1 (see FIG. 60). By this process, not only the exposed surface of the substrate 1 but also the exposed surfaces of the non-single crystal silicon film 7 are oxidized, and the ends of the oxidized portions of the substrate 1 and the non-single crystal silicon film 7 are coupled with the underlying silicon oxide film 5. Accordingly the silicon oxide film 31O1 is formed in the entire surface of the trench 2 except on the silicon nitride film 6. The edges of the entrance of opening in the substrate 1 and the edges of the non-single crystal silicon film, which are positioned opposite to the entrance edges, are also oxidized by this thermal oxidation, so that these edges are rounded.

Figure 60:
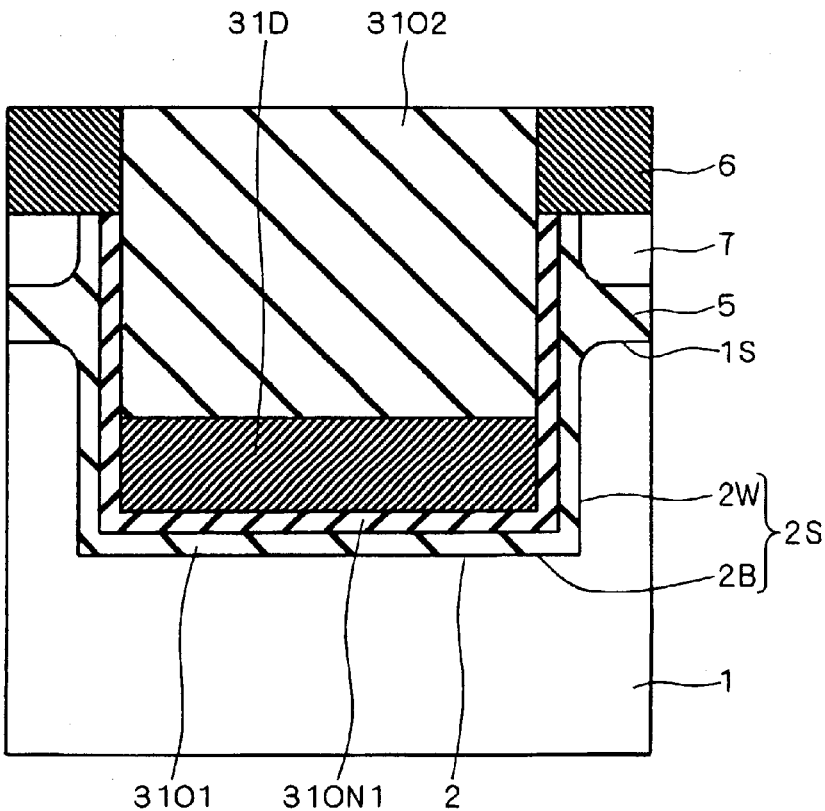
Figure 61:
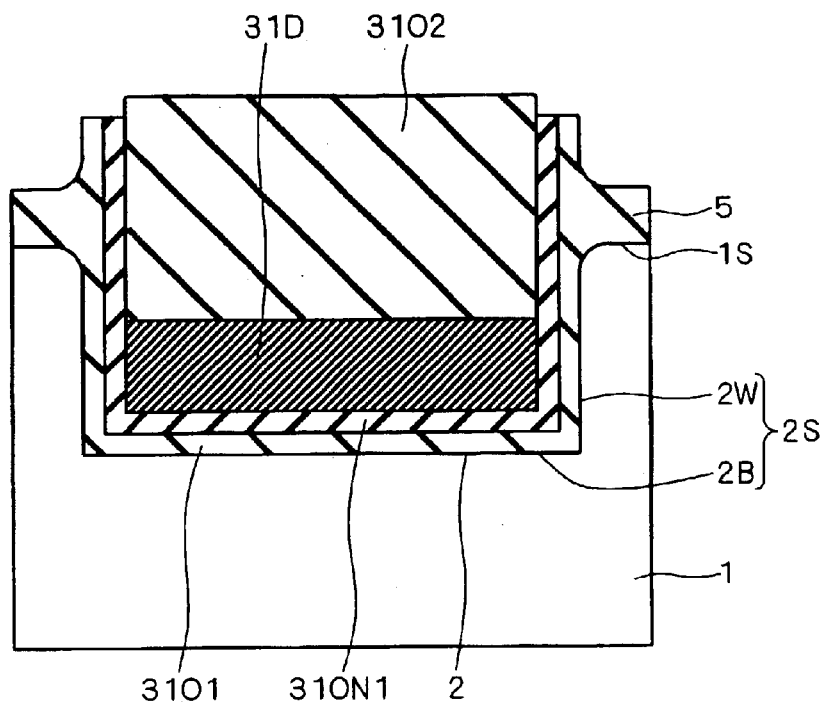
Figure 62:
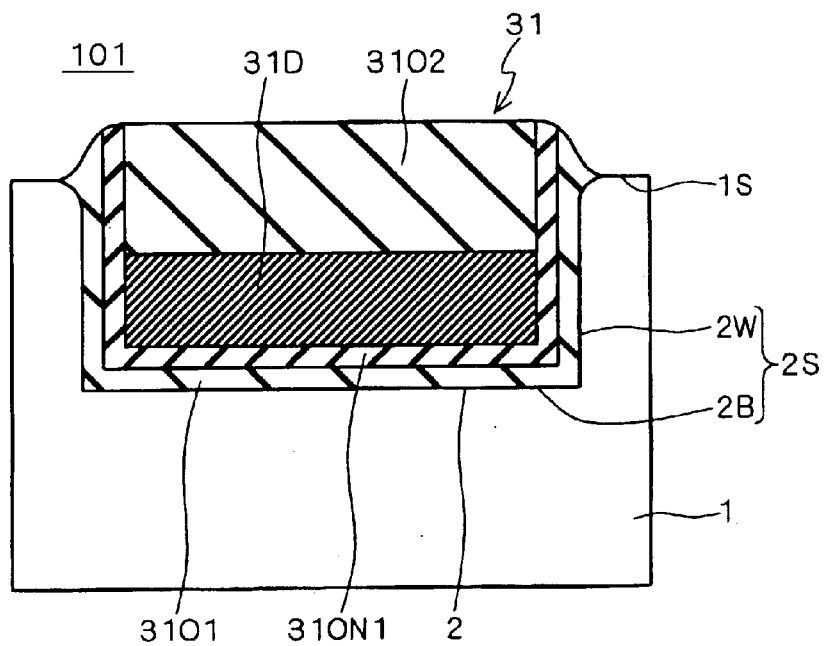
Figure 63:
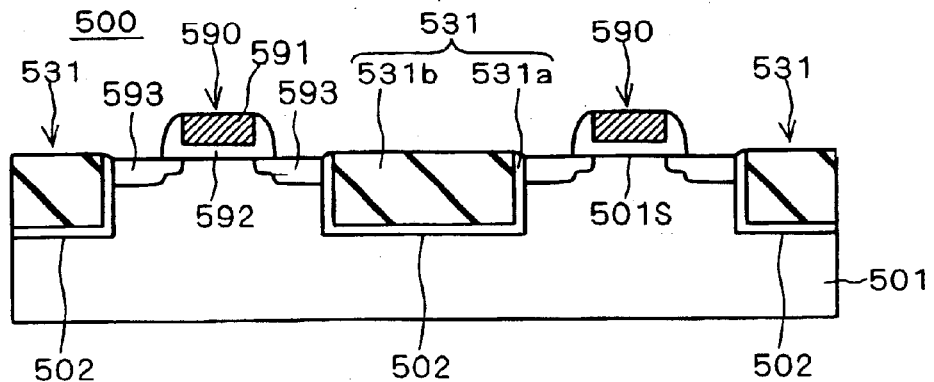
FIG. 63 is a cross-sectional view used to describe a conventional semiconductor device.
Figure 64:
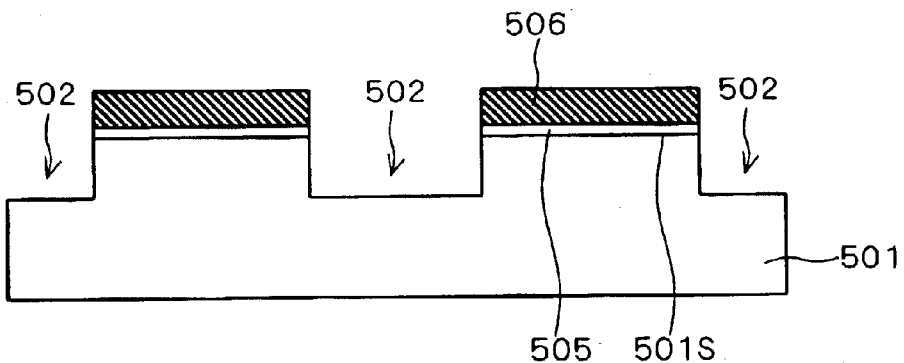
FIGS. 64 to 67 are cross-sectional views used to describe a method for manufacturing the conventional semiconductor device.
Figure 65:
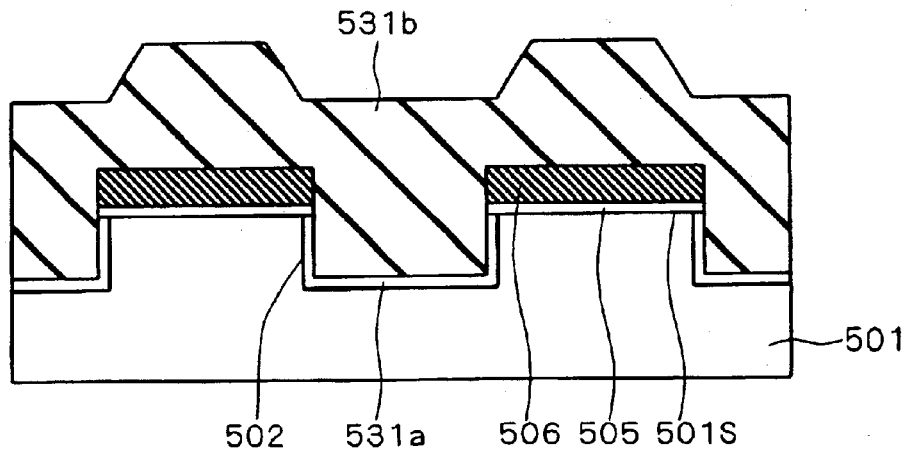
Figure 66:
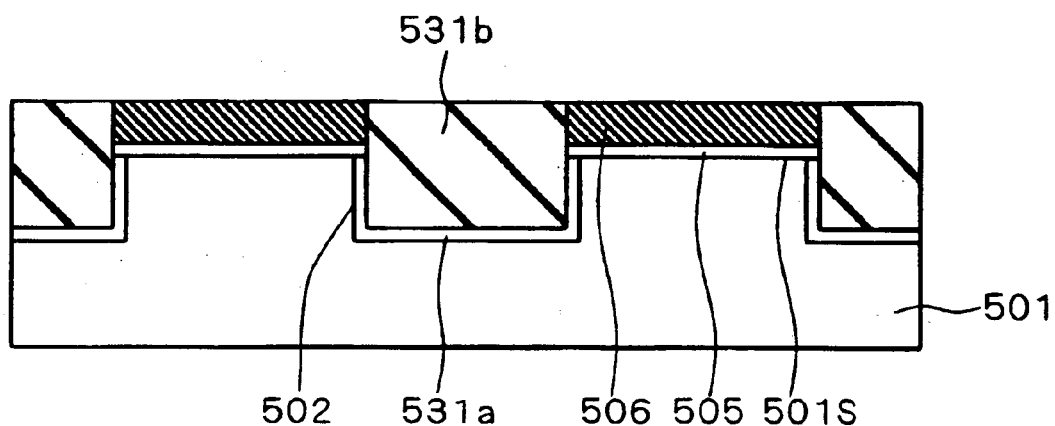
Figure 67:
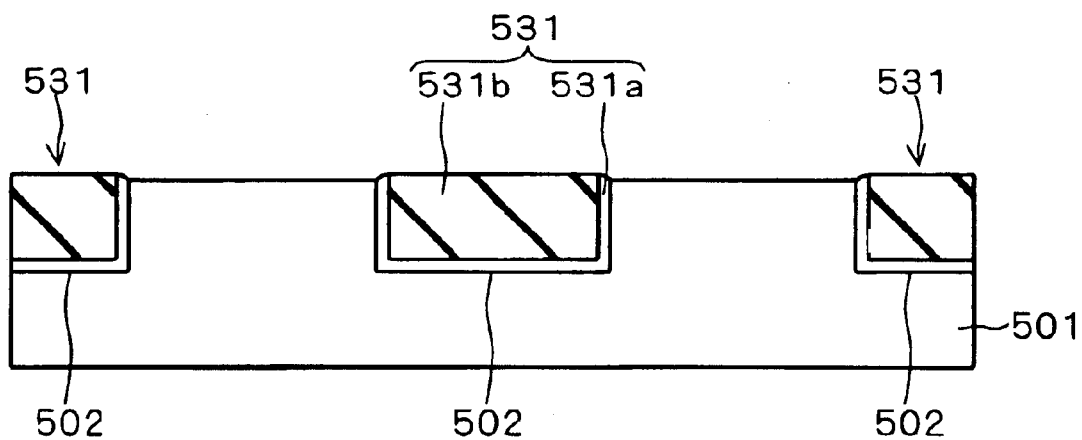

Then, the oxynitride film 31ON1, doped silicon oxide film 31D, and silicon oxide film 31O2 are formed as shown in the above-described manufacturing method, and CMP is applied by using the silicon nitride film 6 as a stopper (see FIG. 60). Next, the silicon oxide film 31O2 is partially removed with hydrofluoric acid to adjust the height of the element isolation structure 31. Next, the silicon nitride film 6 is removed and the non-single crystal silicon film 7 is removed, e.g. by dry etching (see FIG. 61). The underlying silicon oxide film 5 is then removed, whereby the element isolation structure 31 is completed (see FIG. 62).

Subsequently, MOSFETs 90 are formed to complete the semiconductor device 101 shown in FIG. 1.

According to the manufacturing method of the first modification, the thermal oxidation film (silicon oxide film) 31O1 protrudes from the substrate's main surface 1S by the thickness of the non-single crystal silicon film 7 and the underlying silicon oxide film (their dimensions perpendicular to the substrate's main surface 1S). Accordingly, even when the ends of the silicon oxide film 31O1 are etched during etching of the underlying silicon oxide film 5, the silicon oxide film 31O1 still protrudes from the substrate's main surface 1S. It is thus possible to more reliably prevent the edges of the element isolation structure 31 from being recessed below the substrate's main surface 1S. It is therefore possible to prevent troubles due to such recess formation (e.g. inverse narrow channel effect). Furthermore, the silicon oxide film 31O1 that has been formed by thermal oxidation has higher etching resistance than silicon oxide film formed by CVD (CVD oxide film), so that the formation of recesses can be more reliably prevented than when the protrusions of the silicon oxide film 31O1 are formed by CVD.

Considering that this effect is obtained by the application of the non-single crystal silicon film 7 and that the non-single crystal silicon film 7 can be used as a stopper during the CMP process of the silicon oxide film 31O2, the same effect can be obtained even when the silicon nitride film 6 is not used. However, as compared with the non-single crystal silicon film 7, the silicon nitride film 6 has a higher CMP selectivity ratio with respect to the silicon oxide film 31O2, so that it enables more precise control of the height of the element isolation structure 31 during the CMP.

Second Modification of the First to Fifth Preferred Embodiments

The description has shown examples in which the doped insulators (silicon oxide films) 31D to 35D are doped with fluorine. However, the gap-filling property can be improved also by doping them with boron, phosphorus, arsenic, chlorine, iodine, bromine, etc., as well as fluorine, so as to suppress formation of voids. Also, the same effect can be obtained by doping them with two or more of these elements like fluorine.

Third Modification of the First to Fifth Preferred Embodiments

While the doped silicon oxide films 31D to 35D and the silicon oxide films 31O2 to 35O2 are deposited by HDP-CVD in the examples described above, other CVD methods or coating methods can provide the same effects.

Fourth Modification of the First to Fifth Preferred Embodiments

While the description above has shown, as the second manufacturing method, examples in which the doped silicon oxide films 31D to 35D are partially removed by wet etching with hydrofluoric acid, the same effects can be obtained by using vapor-phase etching or dry etching. Also, for example, the silicon oxide films 31D to 35D may be partially removed with plasma before the deposition of the silicon oxide films 31O2 to 35O2 in the apparatus for forming the films 31O2 to 35O2.

Fifth Modification of the First to Fifth Preferred Embodiments

Furthermore, the description above has shown examples in which the oxynitride films 31ON1, 32ON1, 34ON1, 35ON1, 33ON2 to 35ON2 are formed by plasma nitridation or thermal nitridation process, but the oxynitride films 31ON1 etc. may be deposited, e.g. by CVD. With deposition methods, the aspect ratio of the trenches 2 becomes larger than when nitridation is used, so that the effect of suppressing void formation is lessened. However, other effects can be obtained, such as the effect of preventing impurity diffusion from the silicon oxide film 31D and the like, and the effect of preventing thickness reduction of the gate insulating film 92.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor substrate having a main surface and a trench, said trench having an entrance formed in said main surface;

a doped insulator doped with impurities and disposed in said trench;

an undoped insulator not being doped with impurities and disposed in said trench, said undoped insulator being positioned opposite to a bottom surface of said trench with said doped insulator interposed therebetween;

a first oxynitride film disposed in said trench between said doped insulator and said semiconductor substrate and between said undoped insulator and said semiconductor substrate; and a second oxynitride film disposed between said doped insulator and said undoped insulator, wherein said doped insulator is isolated from said semiconductor substrate by said undoped insulator and said first oxynitride film.

2. The semiconductor device according to claim 1, further comprising a silicon oxide film disposed between said first oxynitride film and said semiconductor substrate, wherein said first oxynitride film is formed by a nitridation process that utilizes said silicon oxide film.

3. The semiconductor device according to claim 2, further comprising an MIS-type transistor disposed in an area on said main surface of said semiconductor substrate where said trench is absent.

4. The semiconductor device according to claim 1, wherein said impurities in said doped insulator comprise at least one element among fluorine, boron, phosphorus, arsenic, chlorine, iodine, and bromine.

5. The semiconductor device according to claim 4, further comprising an MIS-type transistor disposed in an area on said main surface of said semiconductor substrate where said trench is absent.

6. The semiconductor device according to claim 1, further comprising an MIS-type transistor disposed in an area on said main surface of said semiconductor substrate where said trench is absent.

7. A semiconductor device comprising:

a semiconductor substrate having a main surface and a trench, said trench having an entrance formed in said main surface;

a doped insulator doped with impurities and disposed in said trench;

an undoped insulator not being doped with impurities and disposed in said trench, said undoped insulator being positioned opposite to a bottom surface of said trench with said doped insulator interposed therebetween;

a silicon oxide film disposed in said trench between said doped insulator and said semiconductor substrate;

an oxynitride film disposed in said trench between said undoped insulator and said semiconductor substrate and between said undoped insulator and said doped insulator; and second oxynitride film disposed between said doped insulator and said undoped insulator, wherein said doped insulator is isolated from said semiconductor substrate by said silicon oxide film, said undoped insulator and said oxynitride film.

8. The semiconductor device according to claim 7, wherein said impurities in said doped insulator comprise at least one element among fluorine, boron, phosphorus, arsenic, chlorine, iodine, and bromine.

9. The semiconductor device according to claim 8, further comprising an MIS-type transistor disposed in an area on said main surface of said semiconductor substrate where said trench is absent.

10. The semiconductor device according to claim 7, further comprising an MIS-type transistor disposed in an area on said main surface of said semiconductor substrate where said trench is absent.

* * * * *